US010838276B2

(12) United States Patent
Lee et al.

(10) Patent No.: US 10,838,276 B2
(45) Date of Patent: Nov. 17, 2020

(54) LIQUID CRYSTAL DISPLAY DEVICE

(71) Applicant: LG Display Co., Ltd., Seoul (KR)

(72) Inventors: ChanHo Lee, Paju-si (KR); JaeHyung Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/517,360

(22) Filed: Jul. 19, 2019

(65) Prior Publication Data
US 2020/0057345 A1 Feb. 20, 2020

(30) Foreign Application Priority Data

Aug. 20, 2018 (KR) .................. 10-2018-0096901

(51) Int. Cl.
G02F 1/1362 (2006.01)
G02F 1/1368 (2006.01)
G09G 3/36 (2006.01)
(52) U.S. Cl.
CPC ..... *G02F 1/136286* (2013.01); *G09G 3/3677* (2013.01); *G02F 1/1368* (2013.01); *G09G 2300/043* (2013.01); *G09G 2300/0426* (2013.01); *G09G 2300/0809* (2013.01); *G09G 2300/0876* (2013.01); *G09G 2320/0204* (2013.01); *G09G 2320/0247* (2013.01)
(58) Field of Classification Search
CPC ............. G02F 1/136286; G02F 1/1368; G02F 1/134363; G09G 3/3677; G09G 2300/0426; G09G 2300/043; G09G 2300/0809; G09G 2300/0876; G09G 2320/0247; G09G 2320/0204
See application file for complete search history.

(56) References Cited

U.S. PATENT DOCUMENTS

| 6,292,163 | B1 | 9/2001 | Nam et al. |
| 8,400,383 | B2 | 3/2013 | Cho et al. |
| 10,126,588 | B2 | 11/2018 | Byun |
| 10,423,029 | B2 | 9/2019 | Byun |

(Continued)

FOREIGN PATENT DOCUMENTS

| KR | 10-1999-003509 A | 1/1999 |
| TW | 200949401 A | 12/2009 |
| TW | 201723614 A | 7/2017 |

OTHER PUBLICATIONS

Taiwan Intellectual Property Office, Office Action, TW Patent Application No. 108126205, dated Aug. 13, 2020, five pages.

*Primary Examiner* — Angela K Davison
(74) *Attorney, Agent, or Firm* — Fenwick & West LLP

(57) ABSTRACT

A liquid crystal display device includes a plurality of gate lines and data lines that intersect each other on a substrate and define a plurality of sub-pixels, a plurality of common electrodes and pixel electrodes that are alternately disposed within the sub-pixels, a first thin film transistor comprising a first gate electrode connected to the gate line, a first source electrode connected to the data line, and a first drain electrode connected to the pixel electrode, a first common line applied with a first common voltage, and a second thin film transistor comprising a second gate electrode connected to the gate line, a second source electrode connected to the first common line, and a second drain electrode connected to the common electrode.

21 Claims, 18 Drawing Sheets

(56) References Cited

U.S. PATENT DOCUMENTS

| | | | |
|---|---|---|---|
| 2005/0237465 A1* | 10/2005 | Lu | G02F 1/134363 349/141 |
| 2009/0290081 A1 | 11/2009 | Cho et al. | |
| 2016/0291367 A1* | 10/2016 | Cheng | G02F 1/136213 |
| 2017/0097542 A1 | 4/2017 | Byun | |
| 2018/0373089 A1 | 12/2018 | Byun | |

* cited by examiner

LIQUID CRYSTAL DISPLAY DEVICE

CROSS-REFERENCE TO RELATED APPLICATIONS

This application claims the priority of Republic of Korea Patent Application No. 10-2018-0096901 filed on Aug. 20, 2018, which is incorporated herein by reference in its entirety.

BACKGROUND

Field of the Disclosure

The present disclosure relates to a liquid crystal display device, and more particularly, to a liquid crystal display device which can be driven at a low frequency.

Description of the Related Art

With the progress of the information-oriented society, various types of demands for display devices for displaying an image are increasing. Recently, various types of flat display devices such as a liquid crystal display device (LCD) and an organic light-emitting diode (OLED) have been used.

LCDs, among these flat display devices, are small, lightweight, thin, and low-power consuming and thus widely used.

In general, an LCD receives a clock at a driving frequency of 60 Hz input from an external system and operates at this driving frequency.

In this case, the display device operates for rapidly changing images such as a video and rarely changing images such as a still image at substantially the same driving frequency, which causes an increase in power consumption.

To overcome this problem, a variable refresh rate (VRR) technique has been suggested. According to the VRR technique, the display device can be driven to display a video at a normal frequency of 60 Hz and a still image at a lower frequency than the normal frequency and thus can reduce power consumption.

Each pixel is connected to a single gate line and a single data line, and a thin film transistor (TFT) and a storage capacitor (Cst) are provided to drive the pixel. The TFT is provided at an intersection between the gate line and the data line. The TFT is composed of a gate electrode protruding from the gate line, a source electrode protruding from the data line, and a drain electrode spaced apart from the source electrode and connected to a pixel electrode.

The Cst is provided where a common line disposed in parallel to the gate line overlaps the pixel electrode. Meanwhile, a liquid crystal capacitor (Clc) is provided in a circuit manner between the drain electrode and the common electrode. A common voltage is a constant voltage. A kickback voltage ($\Delta Vp$) which is a voltage of a current applied to liquid crystal is generated due to a parasitic capacitor (Cgs) between the gate electrode and the source electrode or the drain electrode. The $\Delta Vp$ becomes a cause of deterioration of liquid crystal.

Meanwhile, when the display device is driven at a low frequency of 60 Hz or less, the holding time increases. Thus, a pixel voltage drop increases. Therefore, a luminance deteriorates, and defects such as flickers, image sticking, and the like occur. For example, when the display device is driven at 120 Hz, an effective voltage (Vrms) is 3.35 V and a transmittance is about 21.6%, whereas when the display device is driven at 40 Hz, the Vrms decreases to 3.11 V and the transmittance decreases to about 15.7%.

To solve this problem, the area of the Cst needs to be increased. However, an increase in the area of the Cst has not made a significant improvement.

SUMMARY

An object to be achieved by the present disclosure is to provide a liquid crystal display device. The liquid crystal display device can minimize luminance degradation caused by low-frequency driving and improve flickers by synchronizing a common voltage as a reference for a kickback voltage with a pixel voltage.

Objects of the present disclosure are not limited to the above-mentioned objects, and other objects, which are not mentioned above, can be clearly understood by those skilled in the art from the following descriptions.

According to an aspect of the present disclosure, a liquid crystal display device is provided. The liquid crystal display device includes a plurality of gate lines and a plurality of data lines that intersect each other on a substrate and define a plurality of sub-pixels. The liquid crystal display device also includes a plurality of common electrodes and a plurality of pixel electrodes that are alternately disposed within the sub-pixels. The liquid crystal display device further includes a first thin film transistor. The first thin film transistor comprises a first gate electrode connected to the gate line, a first source electrode connected to the data line, and a first drain electrode connected to the pixel electrode. The liquid crystal display device further includes a first common line applied with a first common voltage. The liquid crystal display device also includes a second thin film transistor. The second thin film transistor comprises a second gate electrode connected to the gate line, a second source electrode connected to the first common line, and a second drain electrode connected to the common electrode.

Other detailed matters of the exemplary embodiments are included in the detailed description and the drawings.

According to the present disclosure, a transistor using a common voltage as a source is further provided. Thus, it is possible to minimize luminance degradation caused by low-frequency driving and improve flickers by synchronizing the common voltage with a pixel voltage. Therefore, the display quality can be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
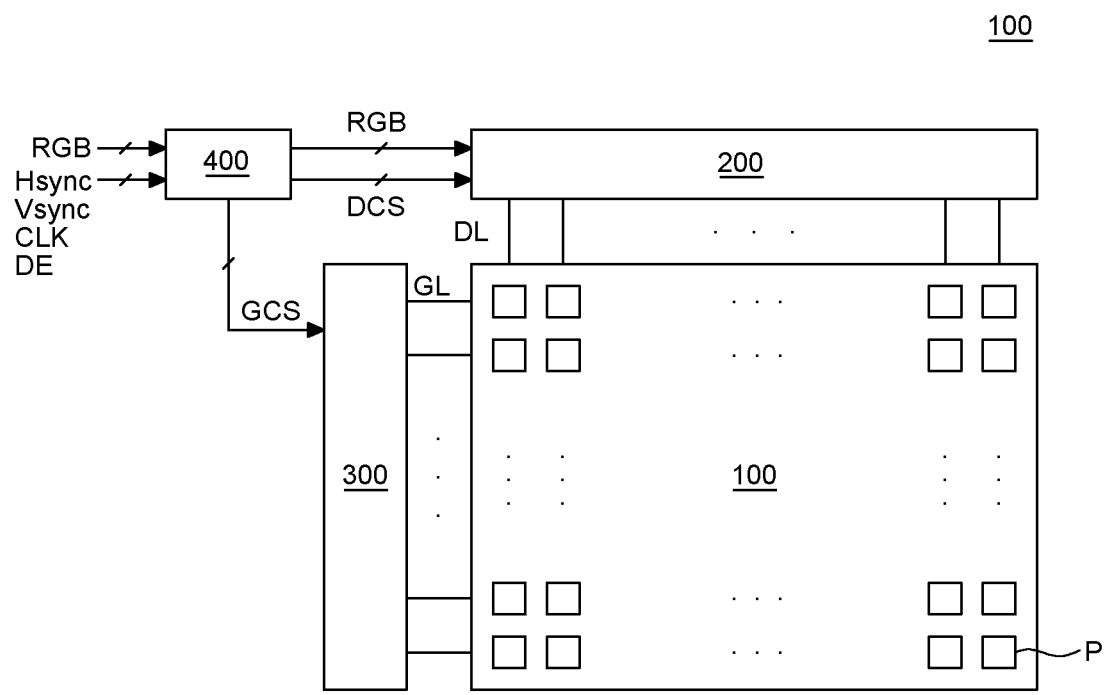
FIG. 1 is a block diagram schematically illustrating a liquid crystal display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereafter, various embodiments of the present disclosure will be described in detail with reference to the accompanying drawings.

FIG. 1 is a block diagram schematically illustrating a liquid crystal display device according to an embodiment of the present disclosure.

Referring to FIG. 1, the liquid crystal display device according to the present disclosure may include a display panel 100 in which a plurality of pixels P is disposed in a matrix. The liquid crystal display device according to the present disclosure may also include a driving circuit that drives the display panel 100. The driving circuit that drives the display panel 100 may include a data driving circuit 200, a gate driving circuit 300, and a timing control circuit 400.

The liquid crystal display device according to the present disclosure may be configured as a variable refresh rate (VRR) liquid crystal display device whose frequency changes with an image displayed. However, the present disclosure is not limited thereto.

When the VRR liquid crystal display device displays rapidly changing images such as a video, it may be driven in a normal frequency mode at a normal frequency of 60 Hz which is input as a driving frequency from an external system.

When the VRR liquid crystal display device displays rarely changing images such as a still image, it may be driven in a low frequency mode at a frequency lower than the normal frequency. The number of frames decreases in the low frequency mode, compared to the normal frequency mode. Thus, the number of data write operations, i.e., refresh operations, decreases. Therefore, power consumption of the liquid crystal display device can be reduced.

In the display panel 100, various lines that transfer drive signals for driving the pixels P may be provided.

Herein, for example, each of a plurality of data lines DL that transfers data voltage may be extended in a column line direction and connected to a pixel P in a corresponding column line. Further, each of a plurality of gate lines GL that transfers gate voltage may be extended in a row line direction and connected to a pixel P in a corresponding row line.

The timing control circuit 400 may control drive timing of the data driving circuit 200 and the gate driving circuit 300. The timing control circuit 400 may reorder digital data RGB input from the external system to be suitable for resolution of display panel 100 and supply the reordered RGB to the data driving circuit 200.

Further, the timing control circuit 400 may generate a data control signal DCS for controlling operation timing of the data driving circuit 200 and a gate control signal GCS for controlling operation timing of the gate driving circuit 300. The timing control circuit 400 generates these signals based on timing signals such as vertical and horizontal synchronous signals Vsync and Hsync, clock signals CLK, and data enable signals DE.

The data driving circuit 200 serves to drive the data lines DL. That is, the data driving circuit 200 may convert the digital data RGB into an analog data voltage based on the data control signal DCS and supply the analog data voltage to the corresponding data line DL.

The gate driving circuit 300 serves to drive the gate lines GL. That is, the gate driving circuit 300 may generate a gate voltage based on the gate control signal GCS and supply the gate voltage to the gate lines GL in sequence.

Figure 2:
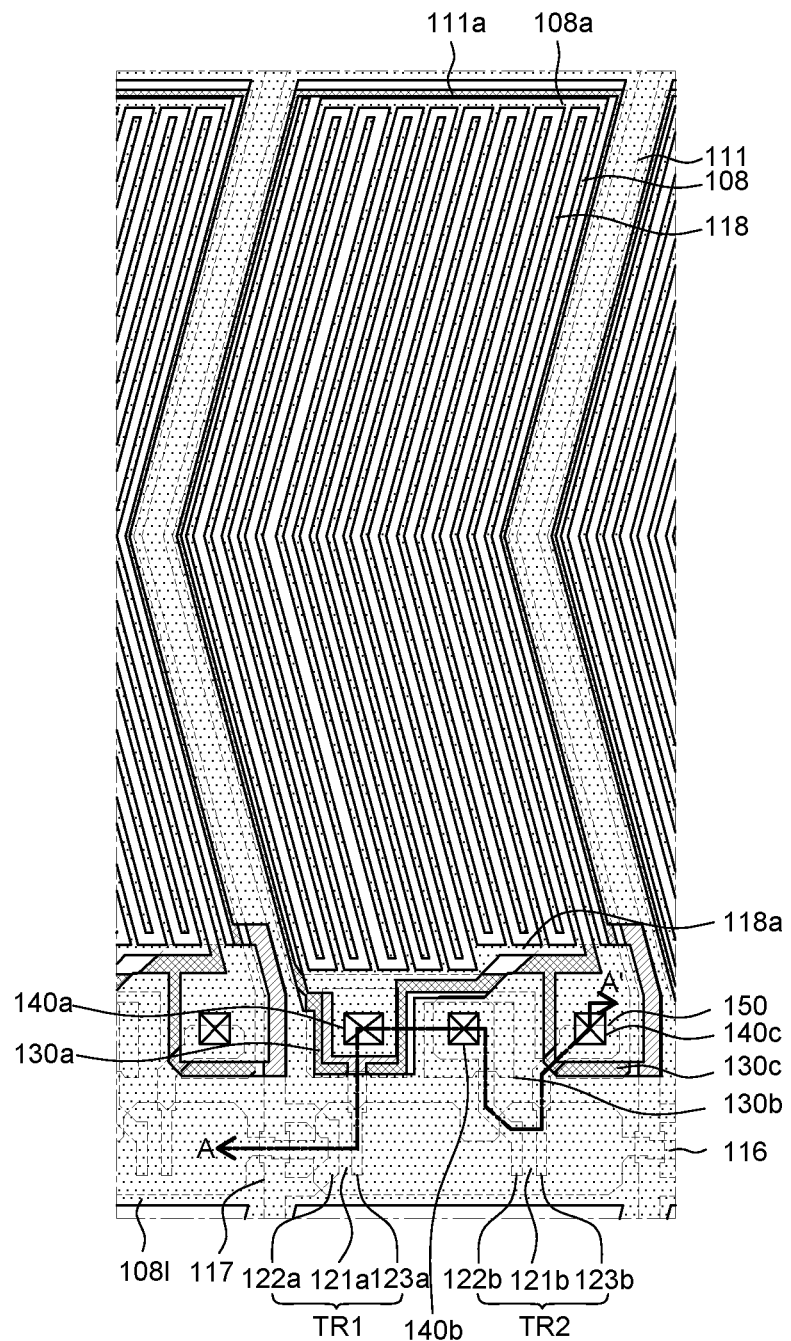
FIG. 2 is a plan view illustrating a liquid crystal display device according to an embodiment of the present disclosure.

FIG. 2 is a plan view illustrating a liquid crystal display device according to an embodiment of the present disclosure.

Figure 3:
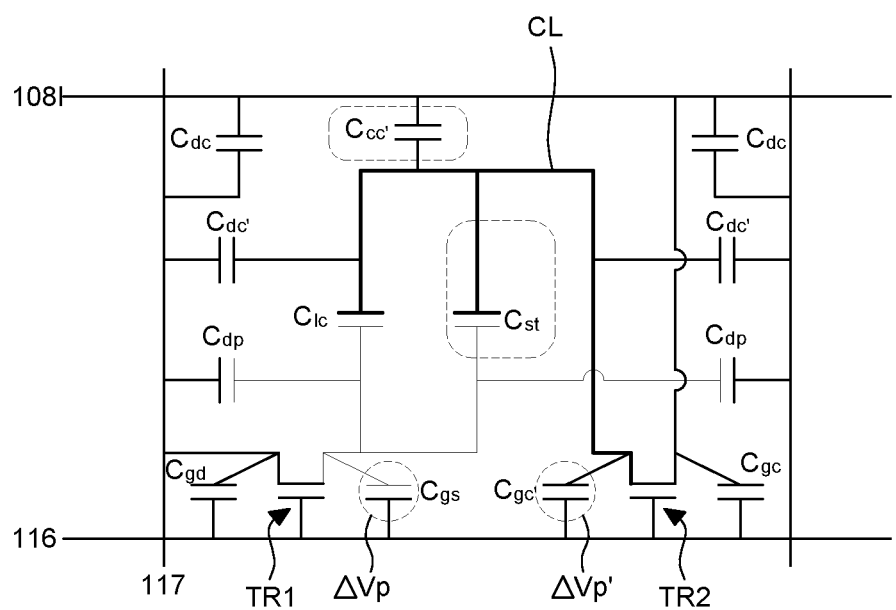
FIG. 3 is an equivalent circuit diagram illustrating an example of a sub-pixel of the liquid crystal display device according to an embodiment of the present disclosure illustrated in FIG. 2.

FIG. 3 is an equivalent circuit diagram illustrating an example of a sub-pixel of the liquid crystal display device according to an embodiment of the present disclosure illustrated in FIG. 2. Herein, FIG. 3 illustrates, for example, first and second thin film transistors (TFTs) TR1 and TR2, and a liquid crystal capacitor Clc, first and second storage capacitors Cst and Ccc' and a plurality of parasitic capacitors Cdc, Cdc', Cdp, Cgd, Cgs, Cgc', and Cgc formed by a plurality of lines, i.e., a gate line 116, a data line 117, a common line 1081, and an internal common line CL.

Figure 4A:
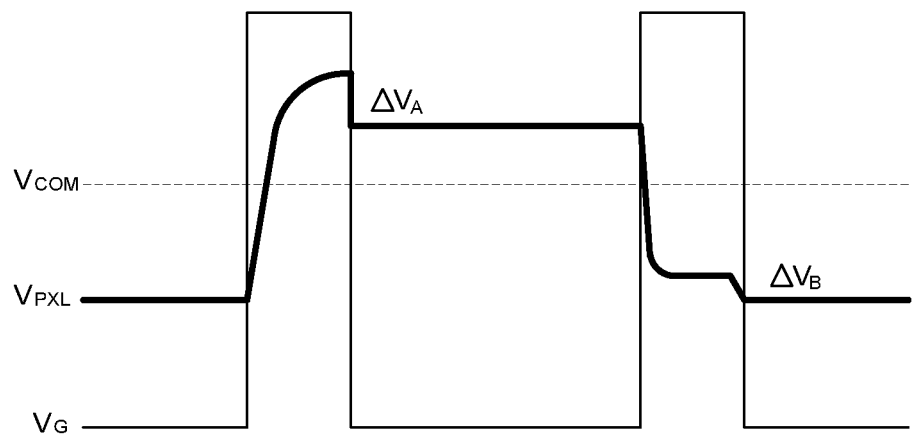
FIG. 4A and FIG. 4B are views comparing a difference between a conventional driving method and a driving method according to an embodiment of the present disclosure.
Figure 4B:
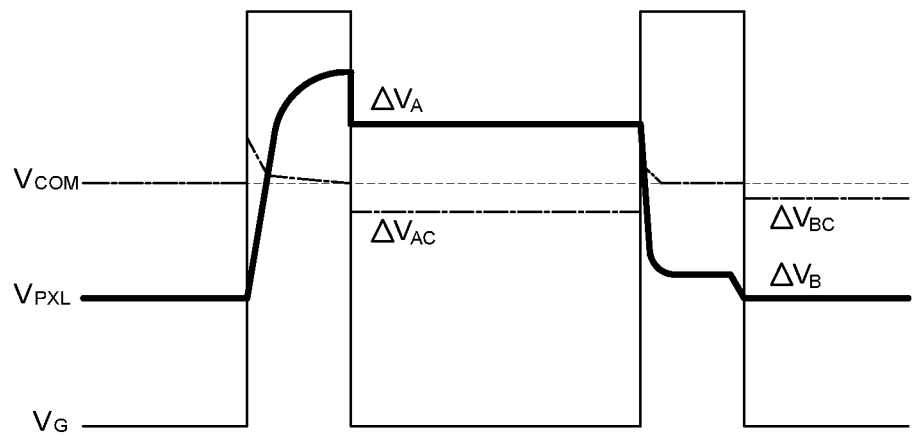

FIG. 4A and FIG. 4B are views comparing a difference between a conventional driving method and a driving method according to an embodiment of the present disclosure.

Figure 5:
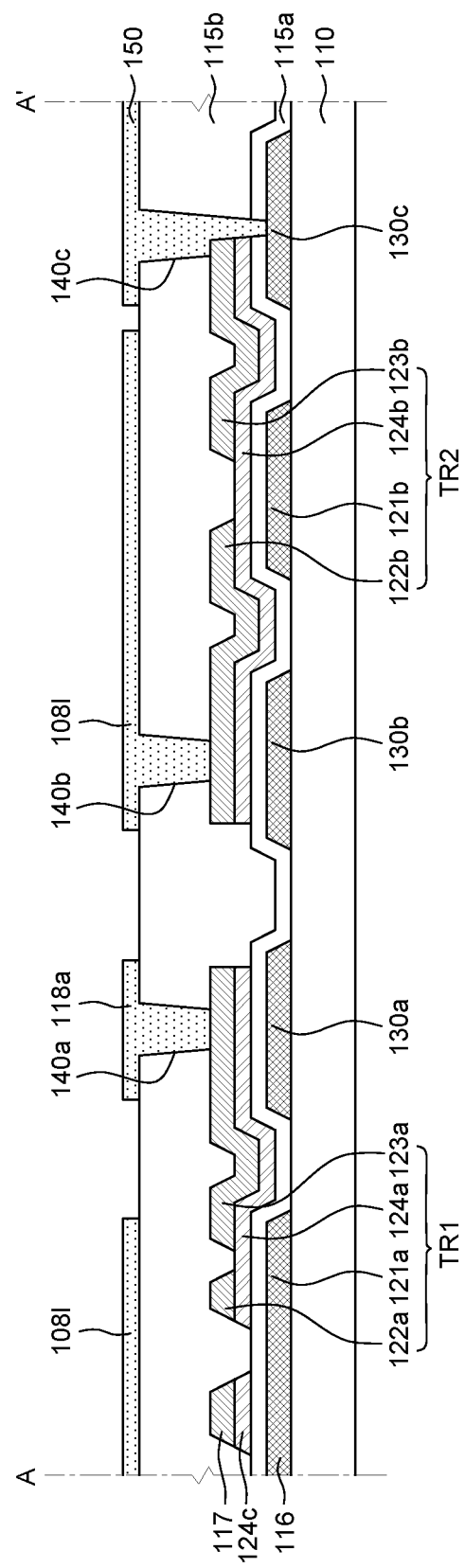
FIG. 5 is a schematic cross-sectional view as taken along a line A-A' of the liquid crystal display device according to an embodiment of the present disclosure illustrated in FIG. 2.

FIG. 5 is a schematic cross-sectional view as taken along a line A-A' of the liquid crystal display device according to an embodiment of the present disclosure illustrated in FIG. 2.

First, referring to FIG. 2, FIG. 3, and FIG. 5, the liquid crystal display device according to an embodiment of the present disclosure may include a plurality of sub-pixels.

The plurality of sub-pixels may be defined in a matrix on a substrate 110 by intersection between a plurality of gate lines 116 and a plurality of data lines 117. That is, the plurality of sub-pixels may be disposed in row and column directions to form a matrix.

The gate lines 116 may be disposed on the substrate 110 in a first direction. Further, the data lines 117 may be disposed in a second direction different from the first direction to define the plurality of sub-pixels together with the gate lines 116.

Each of the plurality of sub-pixels can implement light of a specific color. For example, each sub-pixel may be configured as any one of a red sub-pixel that implements red, a green sub-pixel that implements green, and a blue sub-pixel that implements blue. In this case, a group of a red sub-pixel, a green sub-pixel, and a blue sub-pixel may form a pixel. However, the present disclosure is not limited thereto. A pixel may include a red sub-pixel, a green sub-pixel, a blue sub-pixel, and a white sub-pixel.

As described above, a sub-pixel according to an embodiment of the present disclosure may be configured including the first and second TFTs TR1 and TR2, and the liquid crystal capacitor Clc, the first and second storage capacitors Cst and Ccc' and the plurality of parasitic capacitors Cdc, Cdc', Cdp, Cgd, Cgs, Cgc', and Cgc formed by the plurality of lines, i.e., the gate line 116, the data line 117, the common line 1081, and the internal common line CL.

Each sub-pixel according to an embodiment of the present disclosure includes two TFTs, i.e., the first and second TFTs TR1 and TR2. For example, the first and second TFTs TR1 and TR2 may be disposed at the intersection between the gate line 116 and the data line 117, i.e., the boundary between vertically adjacent sub-pixels. Further, the common line 1081 may be disposed at the boundary between the vertically adjacent sub-pixels. The common line 1081 may be extended above the data line 117.

Within this sub-pixel, a plurality of common electrodes 108 and pixel electrodes 118 may be alternately disposed.

Herein, the first TFT TR1 may comprise a first gate electrode 121a connected to the gate line 116, a first active layer 124a disposed on the first gate electrode 121a, and a first source electrode 122a connected to the data line 117. The first TFT TR1 may also comprise a first drain electrode 123a disposed on the opposite side of the first source electrode 122a and electrically connected to the pixel electrode 118.

That is, the first TFT TR1 serving as a switching element may be connected to the corresponding gate line 116 and data line 117 to receive a gate voltage and a data voltage. The first gate electrode 121a of the first TFT TR1 may be connected to the gate line 116 and the first source electrode 122a may be connected to the data line 117. Further, the first drain electrode 123a may be connected to the liquid crystal capacitor Clc. In this case, the first active layer 124a of the first TFT TR1 may be formed of an oxide semiconductor having excellent mobility or off-current characteristic. However, the present disclosure is not limited thereto.

The liquid crystal display device according to an embodiment of the present disclosure includes the second TFT TR2 using a first common voltage as a source in the sub-pixel in addition to the first TFT TR1.

That is, according to present disclosure, a second common voltage is induced from the first common voltage so as to be synchronized with a data voltage (or pixel voltage) through the second TFT TR2. Thus, it is possible to minimize luminance degradation caused by low-frequency driving and improve flickers.

Herein, the second TFT TR2 may comprise a second gate electrode 121b connected to the gate line 116, a second active layer 124b disposed on the second gate electrode 121b, and a second source electrode 122b electrically connected to the common line 1081. The second TFT TR2 may also comprise a second drain electrode 123b electrically connected to the common electrode 108 through a connection electrode 150.

The liquid crystal capacitor Clc may be composed of the pixel electrode 118 and the common electrode 108 disposed on the opposite sides, and a liquid crystal layer filled between the pixel electrode 118 and the common electrode 108.

The pixel electrode 118 may be electrically connected to the first drain electrode 123a of the first TFT TR1 to receive a pixel voltage. The common electrode 108 may be electrically connected to the second drain electrode 123b of the second TFT TR2 to receive a second common voltage which is synchronized with the pixel voltage. A difference between the pixel voltage and the second common voltage generates an electric field between the pixel electrode 118 and the common electrode 108. Therefore, the alignment of liquid crystal molecules is changed, and, thus, an image can be displayed.

The first storage capacitor Cst is connected in parallel to the liquid crystal capacitor Clc and store data voltage, i.e., pixel voltage, applied to the pixel electrode 118, until a next frame. The second storage capacitor Ccc' is connected in series to the liquid crystal capacitor Clc and the first storage capacitor Cst, respectively.

Hereafter, the laminated structure of the liquid crystal display device according to an embodiment of the present disclosure will be described in detail.

The gate line 116, the first gate electrode 121a, the second gate electrode 121b, and first, second and third electrodes 130a, 130b, and 130c may be disposed on the same layer on the substrate 110.

The first and second gate electrodes 121a and 121b may form a part of the gate line 116. Therefore, the same gate voltage may be applied to the first gate electrode 121a and the second gate electrode 121b.

In this case, each of the first drain electrode 123a, the second source electrode 122b, and the second drain electrode 123b may be extended in one direction. The first electrode 130a, the second electrode 130b, and the third electrode 130c may be disposed under the extended first drain electrode 123a, second source electrode 122b and second drain electrode 123b, respectively.

Further, a shield line 111 may be disposed on at least one side of the data line 117 and connected to the first and third electrodes 130a and 130c. The shield line 111 may shield the interference of data signals in a lateral electric field.

The other end of the shield line 111 to which the first and third electrodes 130a and 130c are not connected may be connected to a connection line 111a disposed in parallel to the gate line 116. However, the present disclosure is not limited thereto.

The gate line 116, the first gate electrode 121a, the second gate electrode 121b, the first, second and third electrodes 130a, 130b, and 130c, the shield line 111, and the connection line 111a may be formed as a first metal layer on the substrate 110.

The first metal layer may contain at least any one selected from the conductive metal group comprising aluminum (Al), Al alloys, tungsten (W), copper (Cu), Cu alloys, molybdenum (Mo), silver (Ag), Ag alloys, gold (Au), Au alloys, chromium (Cr), titanium (Ti), Ti alloys, molytungsten (MoW), molytitanium (MoTi), or copper/molytitanium (Cu/MoTi), or combinations of two or more thereof, or other appropriate materials.

Further, a first insulating layer 115a may be provided on the gate line 116, the first gate electrode 121a, the second gate electrode 121b, the first, second and third electrodes 130a, 130b, and 130c, the shield line 111, and the connection line 111a.

The first insulating layer 115a may be formed of a silicon (Si)-based oxide film, a nitride film, or a compound including the same, a metal oxide film including Al2O3, an organic insulating film, and a material having a low-k value.

For example, the first insulating layer 115a may contain any one selected from the group comprising silicon oxide (SiO2), silicon nitride (SiNx), zirconium oxide (ZrO2), hafnium oxide (HfO2), titanium oxide (TiO2), tantalum oxide (Ta2O5), barium-strontium-titanium oxide (Ba—Sr—Ti—O), or bismuth-zinc-niobium oxide (Bi—Zn—Nb—O), or combinations of two or more thereof, or other appropriate materials.

The first active layer 124a and the second active layer 124b may be disposed on the same layer on the first insulating layer 115a.

The first active layer 124a and the second active layer 124b may be formed as a semiconductor layer.

The semiconductor layer may contain amorphous silicon (a-Si), low temperature poly silicon (LTPS), IGZO-based oxide semiconductor, compound semiconductor, carbon nanotube, graphene, and organic semiconductor.

The oxide semiconductor may be a material in which silicon (Si) is added to an oxide semiconductor including zin (Zn) and one or more selected from the group comprising germanium (Ge), tin (Sn), lead (Pb), indium (In), titanium (Ti), gallium (Ga), or aluminum (Al). For example, the semiconductor layer may be formed of silicon indium zinc oxide (Si—InZnO:SIZO) in which silicon ions are added to indium zinc oxide (InZnO).

If the semiconductor layer is formed of SIZO, the content ratio of Si atoms relative to the total content of Zn, In, and Si atoms in the active layer may range from about 0.001 wt % to about 30 wt %. As the content of Si atoms is increased, it more strongly controls electron generation, and, thus, the mobility may be decreased but the stability of the device may be improved.

In addition to the above-described materials, the oxide semiconductor may further include elements of Group I such as lithium (Li) or potassium (K) and elements of Group II such as magnesium (Mg), calcium (Ca), or strontium (Sr). The oxide semiconductor may also include elements of Group III such as gallium (Ga), Al, In, or yttrium (Y), elements of Group IV such as Ti, zirconium (Zr), Si, Sn, or Ge, and elements of Group V such as tantalum (Ta), vanadium (Vb), niobium (Nb), or antimony (Sb). The oxide semiconductor may further include elements belonging to the lanthanide series such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

The data line 117, the first source electrode 122a, the first drain electrode 123a, the second source electrode 122b, and the second drain electrode 123b may be disposed on the same layer on the first and second active layers 124a and 124b.

Under the data line 117, a semiconductor pattern 124c formed of the same semiconductor layer as the first and second active layers 124a and 124b may be disposed. However, the present disclosure is not limited thereto. If the data line 117 and the first and second active layers 124a and 124b are formed in different mask processes, the semiconductor pattern may not be disposed under the data line 117.

The data line 117, the first source electrode 122a, the first drain electrode 123a, the second source electrode 122b, and the second drain electrode 123b may be formed as a second metal layer.

The second metal layer may contain at least any one selected from the conductive metal group comprising Al, Al alloys, W, Cu, Cu alloys, Mo, Ag, Ag alloys, Au, Au alloys, Cr, Ti, Ti alloys, MoW, MoTi, or Cu/MoTi, or combinations of two or more thereof, or other appropriate materials.

As described above, the data lines 117 are disposed in the second direction different from the first direction to define a plurality of sub-pixels together with the gate lines 116.

The first gate electrode 121a connected to the gate line 116, the first active layer 124a disposed on the first gate electrode 121a, the first source electrode 122a connected to the data line 117, and the first drain electrode 123a disposed on the opposite side of the first source electrode 122a and electrically connected to the pixel electrode 118 may form the first TFT TR1.

The second gate electrode 121b connected to the gate line 116, the second active layer 124b disposed on the second gate electrode 121b, the second source electrode 122b electrically connected to the common line 1081, and the second drain electrode 123b electrically connected to the common electrode 108 through the connection electrode 150 may form the second TFT TR2.

A second insulating layer 115b may be disposed on the same layer on the data line 117, the first source electrode 122a, the first drain electrode 123a, the second source electrode 122b, and the second drain electrode 123b.

The second insulating layer 115b may be formed of a Si-based oxide film, a nitride film, or a compound including the same, a metal oxide film including Al2O3, an organic insulating film, and a material having a low-k value. For example, the second insulating layer 115b may contain any one selected from the group comprising silicon oxide (SiO2), silicon nitride (SiNx), zirconium oxide (ZrO2), hafnium oxide (HfO2), titanium oxide (TiO2), tantalum oxide (Ta2O5), barium-strontium-titanium oxide (Ba—Sr—Ti—O), or bismuth-zinc-niobium oxide (Bi—Zn—Nb—O), or combinations of two or more thereof, or other appropriate materials.

The common electrode 108 and the pixel electrode 118 may be disposed on the same layer on the second insulating layer 115b.

The pixel electrodes 118 and the common electrodes 108 may be alternately disposed within the sub-pixel to form a lateral electric field.

The plurality of common electrodes 108 may be disposed in a finger or herringbone shape within the sub-pixels, but the present disclosure is not limited thereto. The common electrodes 108 may be disposed as straight lines in a vertical direction or a horizontal direction.

The plurality of pixel electrodes 118 may be disposed in a finger or herringbone shape within the sub-pixels, but the present disclosure is not limited thereto. The pixel electrodes 118 may be disposed as straight lines in the vertical direction or the horizontal direction.

A first contact hole 140a that exposes a part of the first drain electrode 123a may be formed by removing a part of the second insulating layer 115b.

One ends of the plurality of pixel electrodes 118 may be connected to a pixel electrode line 118a disposed in parallel to the gate line 116. Therefore, the pixel electrode line 118a may be electrically connected to the first drain electrode 123a through the first contact hole 140a.

Further, a second contact hole 140b that exposes a part of the second source electrode 122b may be formed by removing a part of the second insulating layer 115b.

The second source electrode 122b may be electrically connected to the common line 1081 through the second contact hole 140b.

Furthermore, a third contact hole 140c that exposes a part of a lateral surface of the second drain electrode 123b and a part of a top surface of the third electrode 130c may be formed by removing a part of the second insulating layer 115b and the first insulating layer 115a.

One end of at least one of the plurality of common electrodes 108 may be connected to the connection electrode 150. Therefore, the connection electrode 150 may be electrically connected to the second drain electrode 123b and the third electrode 130c through the third contact hole 140c.

The other ends of the plurality of common electrodes 108 may be connected to a common electrode line 108a disposed in parallel to the gate line 116, but the present disclosure is not limited thereto.

The second source electrode 122b may be applied with the first common voltage through the common line 1081. The second drain electrode 123b may be supplied with the second common voltage different from the first common voltage through the second TFT TR2. Further, second drain electrode 123b may transfer the second common voltage to the common electrode 108 through the connection electrode 150. Therefore, the common electrode 108 according to the present disclosure is applied with the second common voltage instead of the first common voltage.

The second common voltage is synchronized with the pixel voltage.

A part of the first drain electrode 123a is disposed on the first electrode 130a and forms a first storage capacitor Cst together with the first electrode 130a. In this case, the first electrode 130a is connected to the third electrode 130c, and, thus, the second common voltage may be applied to the first electrode 130a. Therefore, the first storage capacitor Cst may have a capacitance between the second common voltage and the pixel voltage.

Meanwhile, the connection electrode 150, the first and third electrodes 130a and 130c, the shield line 111 and the connection line 111a which are applied with the second common voltage may be defined as the internal common line CL.

Therefore, the second storage capacitor Ccc' may have a capacitance between the first common voltage and the second common voltage.

Referring to FIG. 3 and FIG. 4, in an embodiment of the present disclosure, the second TFT TR2 using the first common voltage as a source is further provided and the parasitic capacitor Cgs is designed to be the same as Cgc' to synchronize a kickback voltage.

Thus, the internal common line CL having the second common voltage is formed to further form the second storage capacitor Ccc' between the common line and the internal common line CL.

As described above, the second storage capacitor Ccc' has a capacitance between the first common voltage and the second common voltage and may have a capacitance relating to charging and holding of the first common voltage.

The first storage capacitor Cst between the pixel electrode and the internal common line CL has a capacitance between the pixel voltage and the second common voltage and may have a capacitance relating to charging and holding of the pixel voltage.

A first kickback voltage ΔVp is a voltage of a direct current applied to liquid crystal due to the first parasitic capacitor Cgs between the first gate electrode and the first source electrode or the first drain electrode.

Further, a second kickback voltage ΔVp' is a voltage of a direct current applied to liquid crystal due to the second parasitic capacitor Cgc' between the second gate electrode and the second source electrode or the second drain electrode.

The kickback voltages of the equivalent circuits can be represented by the following equations.

$$\Delta Vp = Cgs \times \Delta Vg/(Cgs+Clc+Cst)$$

$$\Delta Vp' = Cgc' \times \Delta Vg/(Cgc'+Clc+Cst+Ccc')$$

Herein, ΔVg denotes a difference value between a high value Vgh and a low value Vgl of a gate voltage, Clc denotes a value of the liquid crystal capacitor, and Cst denotes a value of the first storage capacitor. Further, Cgs denotes a parasitic capacitance value generated by the first parasitic capacitor between the first gate electrode and the first source electrode or the first drain electrode.

Furthermore, Ccc' denotes a value of the second storage capacitor, Cgc' denotes a parasitic capacitance value generated by the second parasitic capacitor between the second gate electrode and the second source electrode or the second drain electrode.

According to the synchronization condition as ΔVp=ΔVp', Cgs×ΔVg/(Cgs+Clc+Cst) is equal to Cgc'×ΔVg/(Cgc'+Clc+Cst+Ccc').

If the first and second TFTs TR1 and TR2 are designed identically, Cgs is equal to Cgc', and, thus, Cgs×ΔVg/(Cgs+Clc+Cst) is equal to Cgs×ΔVg/(Cgs+Clc+Cst+Ccc').

Therefore, to satisfy ΔVp=ΔVp', the condition of Ccc'≈0 needs to be satisfied.

Therefore, the second storage capacitor Ccc' needs to be designed small to minimize a difference between ΔVp and ΔVp'.

For reference, FIG. 4A illustrates a difference in driving caused by inversion in a typical structure. Herein, $V_{COM}$, $V_{PXL}$, and $V_G$ denote a common voltage, a pixel voltage, and a gate voltage, respectively.

Referring to FIG. 4A, it can be seen that as for the pixel voltage, a kickback voltage of $\Delta V_A$ is generated in a positive frame and a kickback voltage of $\Delta V_B$ is generated in a negative frame.

In this case, it can be seen that $\Delta V_A$ is not equal to $\Delta V_B$, and, thus, the optimum common voltage becomes different for each gray voltage and flickers caused by a difference in luminance occurs.

In contrast, FIG. 4B illustrates a difference in driving caused by inversion in a structure in which a pixel voltage is synchronized with a second common voltage according to the present disclosure. In FIG. 4B, the second common voltage is illustrated by a dashed-dotted line.

Referring to FIG. 4B, it can be seen that as for the pixel voltage, a kickback voltage of $\Delta V_A$ is generated in a positive frame and a kickback voltage of $\Delta V_B$ is generated in a negative frame. Further, it can be seen that as for the second common voltage, a kickback voltage of $\Delta V_{AC}$ is generated in a positive frame and a kickback voltage of $\Delta V_{BC}$ is generated in a negative frame.

In this case, a difference between the pixel voltage and the second common voltage satisfies $\Delta V_A - \Delta V_{AC} = \Delta V_B - \Delta V_{BC}$ in the positive frame and the negative frame. Thus, it can be seen that the difference between the pixel voltage and the second common voltage is self-controlled by ΔVp and ΔVp' at any gray voltage. Therefore, it can be seen that flickers are improved by voltage symmetry for each frame.

Figure 6:
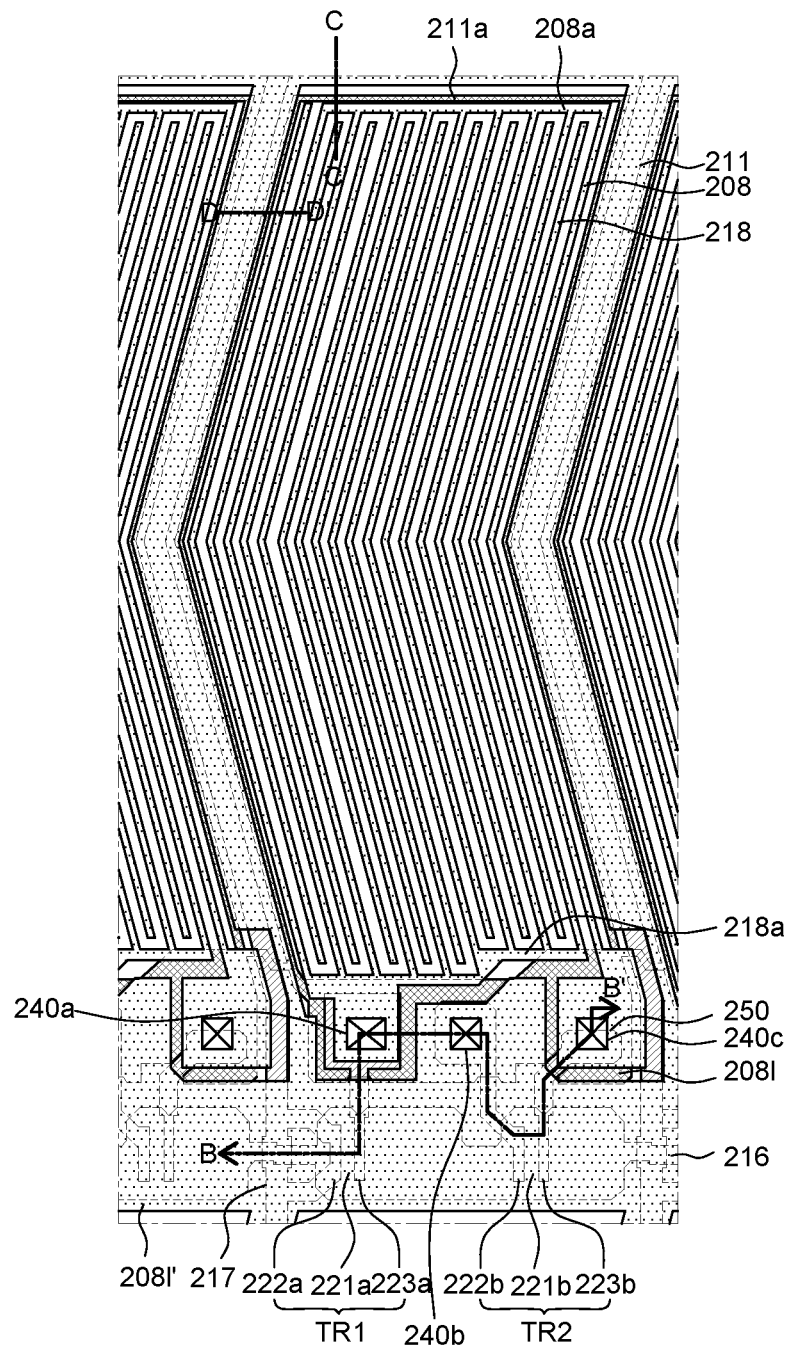
FIG. 6 is a plan view illustrating an example of a liquid crystal display device according to an embodiment of the present disclosure.

FIG. 6 is a plan view illustrating a liquid crystal display device according to an embodiment of the present disclosure.

Figure 7:
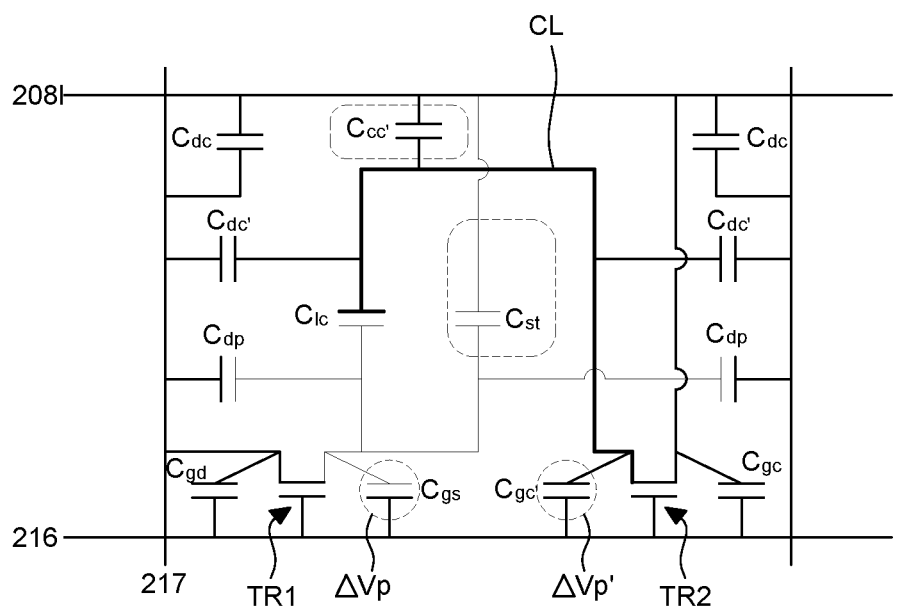
FIG. 7 is an equivalent circuit diagram illustrating an example of a sub-pixel of the liquid crystal display device according to an embodiment of the present disclosure illustrated in FIG. 6.

FIG. 7 is an equivalent circuit diagram illustrating an example of a sub-pixel of the liquid crystal display device according to an embodiment of the present disclosure illustrated in FIG. 6. Herein, FIG. 7 illustrates, for example, the first and second TFTs TR1 and TR2, and the liquid crystal capacitor Clc, the first and second storage capacitors Cst and Ccc' and a plurality of parasitic capacitors Cdc, Cdc', Cdp, Cgd, Cgs, Cgc', and Cgc formed by a plurality of lines, i.e., a gate line 216, a data line 217, a common line 2081, and the internal common line CL.

Figure 8:
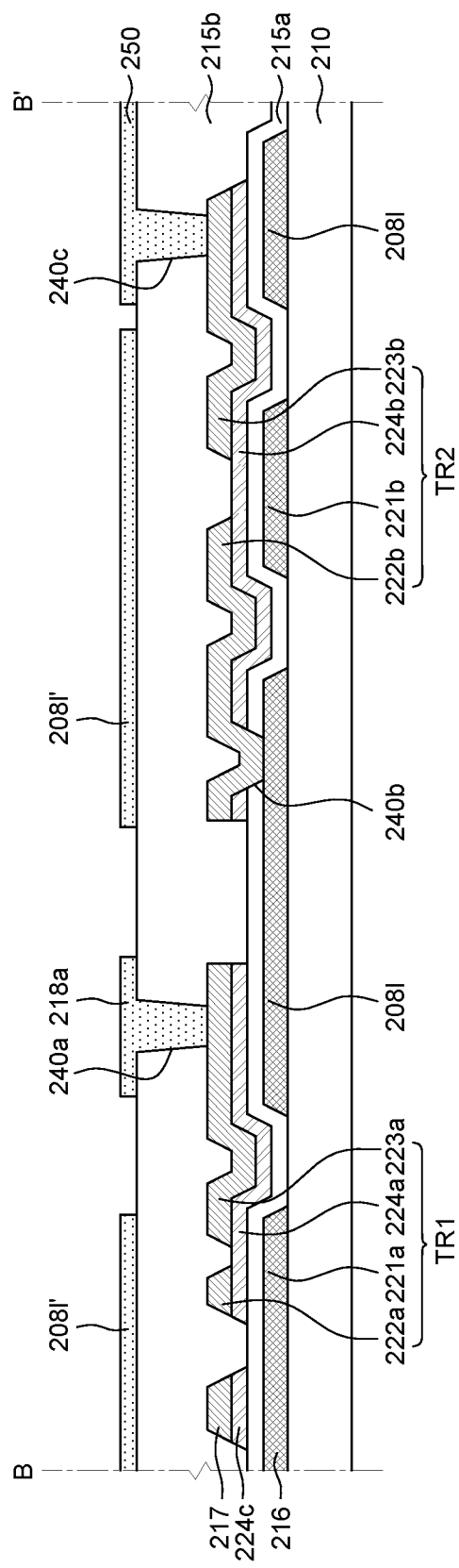
FIG. 8 is a schematic cross-sectional view as taken along a line B-B' of the liquid crystal display device according to an embodiment of the present disclosure illustrated in FIG. 6.

FIG. 8 is a schematic cross-sectional view as taken along a line B-B' of the liquid crystal display device according to an embodiment of the present disclosure illustrated in FIG. 6.

Figure 9A:
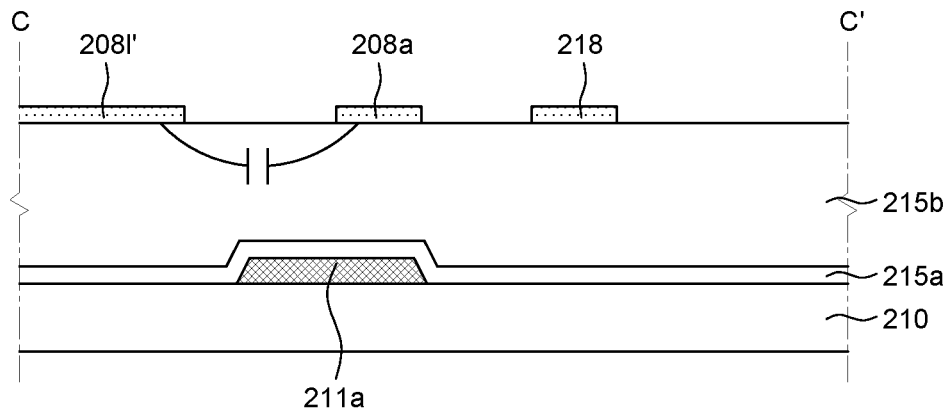
FIG. 9A and FIG. 9B are schematic cross-sectional views as taken along a line C-C' and a line D-D', respectively, of the liquid crystal display device according to an embodiment of the present disclosure illustrated in FIG. 6.
Figure 9B:
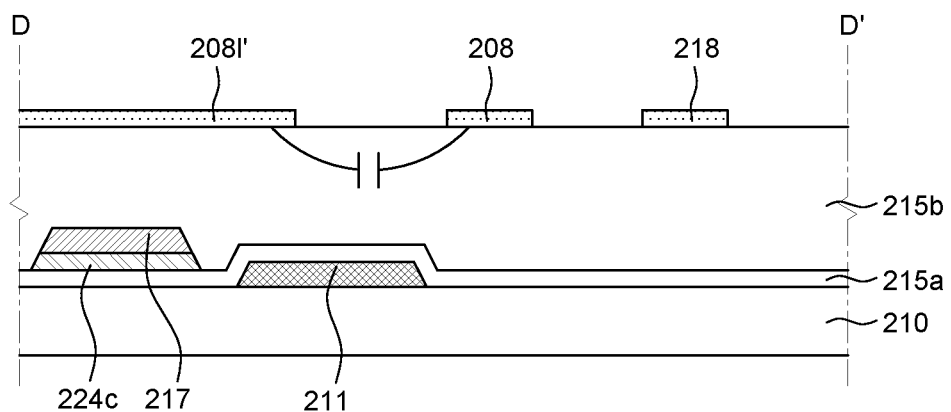

FIG. 9A is a schematic cross-sectional view as taken along a line C-C' of the liquid crystal display device according to an embodiment of the present disclosure illustrated in FIG. 6. Further, FIG. 9B is a schematic cross-sectional view as taken along a line D-D' of the liquid crystal display device according to an embodiment of the present disclosure illustrated in FIG. 6.

The liquid crystal display device according to an embodiment of the present disclosure illustrated in FIG. 6 through FIG. 9B has substantially the same configuration as an embodiment of the present disclosure except that the first storage capacitor is designed to have a capacitance between a first common voltage and a pixel voltage.

Referring to FIG. 6 through FIG. 9B, the liquid crystal display device according to an embodiment of the present disclosure may include a plurality of sub-pixels as in an embodiment of the present disclosure as described above.

The plurality of sub-pixels may be defined in a matrix on a substrate 210 by intersection between a plurality of gate lines 216 and a plurality of data lines 217. That is, the plurality of sub-pixels may be disposed in row and column directions to form a matrix.

For example, the gate lines 216 may be disposed on the substrate 210 in a first direction. Further, the data lines 217 may be disposed in a second direction different from the first direction to define the plurality of sub-pixels together with the gate lines 216.

Each of the plurality of sub-pixels can implement light of a specific color. For example, each sub-pixel may be configured as any one of a red sub-pixel that implements red, a green sub-pixel that implements green, and a blue sub-pixel that implements blue. In this case, a group of a red sub-pixel, a green sub-pixel, and a blue sub-pixel may form a pixel. However, the present disclosure is not limited thereto. A pixel may include a red sub-pixel, a green sub-pixel, a blue sub-pixel, and a white sub-pixel.

As described above, a sub-pixel according to an embodiment of the present disclosure may be configured including the first and second TFTs TR1 and TR2, and the liquid crystal capacitor Clc, the first and second storage capacitors Cst and Ccc' and the plurality of parasitic capacitors Cdc, Cdc', Cdp, Cgd, Cgs, Cgc', and Cgc formed by the plurality of lines, i.e., the gate line 216, the data line 217, the first and second common line 2081 and 2081', and the internal common line CL.

Each sub-pixel according to an embodiment of the present disclosure includes two TFTs, i.e., the first and second TFTs TR1 and TR2 as in an embodiment of the present disclosure as described above. For example, the first and second TFTs TR1 and TR2 may be disposed at the intersection between the gate line 216 and the data line 217, i.e., the boundary between vertically adjacent sub-pixels. Further, first and second common line 2081 and 2081' may be disposed at the boundary between the vertically adjacent sub-pixels. The first common line 2081 may be disposed in parallel to the gate line 216 on the same layer as the gate line 216. The first common line 2081 may apply a first common voltage to a second source electrode 222b of the second TFT TR2. In contrast, the second common line 2081' may be disposed at the boundary between the vertically adjacent sub-pixels on the same layer as a common electrode 208 and a pixel electrode 218. The second common line 2081' may be connected to the first common line 2081 or may be applied with the first common voltage directly from the outside. The second common line 2081' may be extended above the data line 217.

In this case, a shield line 211 may be disposed on at least one side of the data line 217. One end of the shield line 211 may be connected to the first common line 2081. Further, the other end of the shield line 211 may be connected to a connection line 211a disposed in parallel to the gate line 216. The shield line 211 may shield the interference of data signals in a lateral electric field. The connection line 211a and the first common line 2081 may be applied with the first common voltage.

Within this sub-pixel, a plurality of common electrodes 208 and pixel electrodes 218 may be alternately disposed.

Herein, the first TFT TR1 may comprise a first gate electrode 221a connected to the gate line 216, a first active layer 224a disposed on the first gate electrode 221a, and a first source electrode 222a connected to the data line 217. The first TFT TR1 may also comprise a first drain electrode 223a disposed on the opposite side of the first source electrode 222a and electrically connected to the pixel electrode 218 through a first contact hole 240a.

That is, one ends of the plurality of pixel electrodes 218 may be connected to a pixel electrode line 218a disposed in parallel to the gate line 216. Therefore, the pixel electrodes 218 may be electrically connected to the first drain electrode 223a through the pixel electrode line 218a.

As such, the first TFT TR1 serving as a switching element may be connected to the corresponding gate line 216 and data line 217 to receive a gate voltage and a data voltage, respectively. The first gate electrode 221a of the first TFT TR1 may be connected to the gate line 216 and the first source electrode 222a may be connected to the data line 217. Further, the first drain electrode 223a may be connected to the liquid crystal capacitor Clc. In this case, the first active layer 224a of the first TFT TR1 may be formed of an oxide semiconductor having excellent mobility or off-current characteristic. However, the present disclosure is not limited thereto.

The liquid crystal display device according to an embodiment of the present disclosure further includes the second TFT TR2 using the first common voltage as a source in addition to the first TFT TR1 as described above within the sub-pixel.

That is, according to present disclosure, a second common voltage is induced from the first common voltage so as to be synchronized with a data voltage (or pixel voltage) through the second TFT TR2. Thus, it is possible to minimize luminance degradation caused by low-frequency driving and improve flickers.

Herein, the second TFT TR2 may comprise a second gate electrode 221b connected to the gate line 216, a second active layer 224b disposed on the second gate electrode 221b, and a second source electrode 222b electrically connected to the first common line 2081. The second TFT TR2 may also comprise a second drain electrode 223b electrically connected to a connection electrode 250 through a third contact hole 240c.

In this case, one end of at least one of the plurality of common electrodes 208 may be connected to the connection electrode 250. Therefore, the common electrode 208 may be electrically connected to the second drain electrode 223b through the connection electrode 250.

The other ends of the plurality of common electrodes 208 may be connected to a common electrode line 208a disposed in parallel to the gate line 216, but the present disclosure is not limited thereto.

The second source electrode 222b may be electrically connected to the first common line 2081 through a second contact hole 240b.

The liquid crystal capacitor Clc may be composed of the pixel electrode 218 and the common electrode 208 disposed on the opposite sides, and a liquid crystal layer filled between the pixel electrode 218 and the common electrode 208.

The pixel electrode 218 may be electrically connected to the first drain electrode 223a of the first TFT TR1 to receive a pixel voltage. The common electrode 208 may be electrically connected to the second drain electrode 223b of the second TFT TR2 to receive a second common voltage which is synchronized with the pixel voltage. A difference between the pixel voltage and the second common voltage generates an electric field between the pixel electrode 218 and the common electrode 208. Therefore, the alignment of liquid crystal molecules is changed, and, thus, an image can be displayed.

The first storage capacitor Cst is connected in parallel to the liquid crystal capacitor Clc and the second storage capacitor Ccc' that are connected to each other in series and store data voltage, i.e., pixel voltage, applied to the pixel electrode 218, until a next frame.

Hereafter, the laminated structure of the liquid crystal display device according to an embodiment of the present disclosure will be described in detail with reference to FIG. 8, FIG. 9A and FIG. 9B.

The gate line 216, the first gate electrode 221a, the second gate electrode 221b, and the first common line 2081 may be disposed on the same layer on the substrate 210.

The first and second gate electrodes 221a and 221b may form a part of the gate line 216. Therefore, the same gate voltage may be applied to the first gate electrode 221a and the second gate electrode 221b.

In this case, each of the first drain electrode 223a, the second source electrode 222b, and the second drain electrode 223b may be extended in one direction. The first common line 2081 may be disposed under the extended first drain electrode 223a, second source electrode 222b and second drain electrode 223b.

Further, the shield line 211 may be disposed on at least one side of the data line 217. One end of the shield line 211 may be connected to the first common line 2081.

The shield line 211 may shield the interference of data signals in a lateral electric field.

The other end of the shield line 211 may be connected to the connection line 211a disposed in parallel to the gate line 216. However, the present disclosure is not limited thereto.

The connection line 211a and the first common line 2081 may be applied with the first common voltage.

The gate line 216, the first gate electrode 221a, the second gate electrode 221b, the first common line 2081, the shield line 211, and the connection line 211a may be formed as a first metal layer on the substrate 210.

The first metal layer may contain at least one selected from the conductive metal group comprising Al, Al alloys, W, Cu, cu alloys, Mo, Ag, Ag alloys, Au, Au alloys, Cr, Ti, Ti alloys, MoW, MoTi, or Cu/MoTi, or combinations of two or more thereof, or other appropriate materials.

Further, a first insulating layer 215a may be provided on the gate line 216, the first gate electrode 221a, the second gate electrode 221b, the first common line 2081, the shield line 211, and the connection line 211a.

The first insulating layer 215a may be formed of a silicon (Si)-based oxide film, a nitride film, or a compound including the same, a metal oxide film including Al2O3, an organic insulating film, and a material having a low-k value.

For example, the first insulating layer 215a may contain any one selected from the group comprising silicon oxide (SiO2), silicon nitride (SiNx), zirconium oxide (ZrO2), hafnium oxide (HfO2), titanium oxide (TiO2), tantalum oxide (Ta2O5), barium-strontium-titanium oxide (Ba—Sr—Ti—O), or bismuth-zinc-niobium oxide (Bi—Zn—Nb—O), or combinations of two or more thereof, or other appropriate materials.

The first active layer 224a and the second active layer 224b may be disposed on the same layer on the first insulating layer 215a.

The first active layer 224a and the second active layer 224b may be formed as a semiconductor layer.

The semiconductor layer may contain a-Si, LTPS, IGZO-based oxide semiconductor, compound semiconductor, carbon nanotube, graphene, organic semiconductor, and the like.

The oxide semiconductor may be a material in which silicon (Si) is added to an oxide semiconductor including zin (Zn) and at least one selected from the group comprising germanium (Ge), tin (Sn), lead (Pb), indium (In), titanium (Ti), gallium (Ga), or aluminum (Al). For example, the semiconductor layer may be formed of silicon indium zinc oxide (Si—InZnO:SIZO) in which silicon ions are added to indium zinc oxide (InZnO).

If the semiconductor layer is formed of SIZO, the content ratio of Si atoms relative to the total content of Zn, In, and Si atoms in the active layer may range from about 0.001 wt % to about 30 wt %. As the content of Si atoms is increased, it more strongly controls electron generation, and, thus, the mobility may be decreased but the stability of the device may be improved.

In addition to the above-described materials, the oxide semiconductor may further include elements of Group I such as Li or K and elements of Group II such as Mg, Ca, or Sr. The oxide semiconductor may also include elements of Group III such as Ga, Al, In, or Y, elements of Group IV such as Ti, Zr, Si, Sn, or Ge, and elements of Group V such as Ta, Vb, Nb, or Sb. The oxide semiconductor may further include elements belonging to the lanthanide (Ln) series such as La, Ce, Pr, Nd, Pm, Sm, Eu, Gd, Tb, Dy, Ho, Er, Tm, Yb, or Lu.

The data line 217, the first source electrode 222a, the first drain electrode 223a, the second source electrode 222b, and the second drain electrode 223b may be disposed on the same layer on the first and second active layers 224a and 224b.

Under the data line 217, a semiconductor pattern 224c formed of the same semiconductor layer as the first and second active layers 224a and 224b may be disposed. However, the present disclosure is not limited thereto. If the data line 217 and the first and second active layers 224a and 224b are formed in different mask processes, the semiconductor pattern may not be disposed under the data line 217.

The data line 217, the first source electrode 222a, the first drain electrode 223a, the second source electrode 222b, and the second drain electrode 223b may be formed as a second metal layer.

The second metal layer may contain at least one selected from the conductive metal group comprising Al, Al alloys, W, Cu, Cu alloys, Mo, Ag, Ag alloys, Au, Au alloys, Cr, Ti, Ti alloys, MoW, MoTi, or Cu/MoTi, or combinations of two or more thereof, or other appropriate materials.

As described above, the data lines 217 are disposed in the second direction different from the first direction to define a plurality of sub-pixels together with the gate lines 216.

The first gate electrode 221a connected to the gate line 216, the first active layer 224a disposed on the first gate electrode 221a, the first source electrode 222a connected to the data line 217, and the first drain electrode 223a disposed on the opposite side of the first source electrode 222a and electrically connected to the pixel electrode 218 may form the first TFT TR1.

The second gate electrode 221b connected to the gate line 216, the second active layer 224b disposed on the second gate electrode 221b, the second source electrode 222b electrically connected to the first common line 2081, and the second drain electrode 223b electrically connected to the common electrode 208 through the connection electrode 250 may form the second TFT TR2.

A second insulating layer 215b may be disposed on the same layer on the data line 217, the first source electrode 222a, the first drain electrode 223a, the second source electrode 222b, and the second drain electrode 223b.

The second insulating layer 215b may be formed of a Si-based oxide film, a nitride film, or a compound including the same, a metal oxide film including Al2O3, an organic insulating film, and a material having a low-k value. For example, the second insulating layer 215b may contain any one selected from the group comprising silicon oxide (SiO2), silicon nitride (SiNx), zirconium oxide (ZrO2), hafnium oxide (HfO2), titanium oxide (TiO2), tantalum oxide (Ta2O5), barium-strontium-titanium oxide (Ba—Sr—Ti—O), or bismuth-zinc-niobium oxide (Bi—Zn—Nb—O), or combinations of two or more thereof, or other appropriate materials.

The common electrode 208 and the pixel electrode 218 may be disposed on the same layer on the second insulating layer 215b.

The pixel electrodes 218 and the common electrodes 208 may be alternately disposed within the sub-pixel to form a lateral electric field.

The plurality of common electrodes 208 may be disposed in a finger or herringbone shape within the sub-pixels, but the present disclosure is not limited thereto. The common electrodes 208 may be disposed as straight lines in a vertical direction or a horizontal direction.

Further, the plurality of pixel electrodes 218 may be disposed in a finger or herringbone shape within the sub-pixels, but the present disclosure is not limited thereto. The pixel electrodes 218 may be disposed as straight lines in the vertical direction or the horizontal direction.

The first contact hole 240a that exposes a part of the first drain electrode 223a may be formed by removing a part of the second insulating layer 215b.

One ends of the plurality of pixel electrodes 218 may be connected to a pixel electrode line 218a disposed in parallel to the gate line 216. Therefore, the pixel electrode line 218a may be electrically connected to the first drain electrode 223a through the first contact hole 240a.

Further, the second contact hole 240b that exposes a part of the first common line 2081 may be formed by removing a part of the first insulating layer 215a.

The second source electrode 222b may be electrically connected to the first common line 2081 through the second contact hole 240b.

Furthermore, the third contact hole 240c that exposes a part of the second drain electrode 223b may be formed by removing a part of the second insulating layer 215b.

One end of at least one of the plurality of common electrodes 208 may be connected to the connection electrode 250. Therefore, the connection electrode 250 may be electrically connected to the second drain electrode 223b through the third contact hole 240c.

The other ends of the plurality of common electrodes 208 may be connected to the common electrode line 208a disposed in parallel to the gate line 216, but the present disclosure is not limited thereto.

As described above, the second common line 2081' may be disposed at the boundary between the vertically adjacent sub-pixels on the same layer as the common electrode 208 and the pixel electrode 218. The second common line 2081' may be connected to the first common line 2081 or may be applied with the first common voltage directly from the outside. The second common line 2081' may be extended above the data line 217. Therefore, as illustrated in FIG. 9B, the second common line 2081' and the common electrode 208 may form a part of the second storage capacitor Ccc'. Further, as illustrated in FIG. 9A, the second common line 2081' extended above the data line 217 and the common electrode line 208a may form a part of the second storage capacitor Ccc'.

The second source electrode 222b may be applied with the first common voltage through the first common line 2081. The second drain electrode 223b may be supplied with the second common voltage different from the first common voltage through the second TFT TR2. Further, the second drain electrode 223b may transfer the second common voltage to the common electrode 208 through the connection electrode 250. Therefore, the common electrode 208 according to the present disclosure is applied with the second common voltage instead of the first common voltage.

The second common voltage is synchronized with the pixel voltage.

A part of the first drain electrode 223a is disposed on the first common line 2081 and forms the first storage capacitor Cst together with the first common line 2081. In this case, the first storage capacitor Cst may have a capacitance between the first common voltage and the pixel voltage.

Meanwhile, the connection electrode 250, the common electrode 208 in the periphery and the common electrode line 208a which are applied with the second common voltage may be defined as the internal common line CL. The second common line 2081' and the internal common line CL may form the second storage capacitor Ccc'. Therefore, the second storage capacitor Ccc' may have a capacitance between the first common voltage and the second common voltage.

As described above, the second common line 2081' and the internal common line CL are disposed in parallel on the uppermost electrode layer within the sub-pixel to form the second storage capacitor Ccc'. In this case, a huge capacitor may be formed due to the long length of the lines.

In this case, the second storage capacitor Ccc' involves charging of the first common voltage. If Cst and Ccc' are designed identically as in an embodiment of the present disclosure, $\Delta Vp$ resulted from a drop of the pixel voltage is the same as $\Delta Vp'$ resulted from a drop of the second common voltage. Therefore, the effect of $\Delta Vp$ is negligible. This can be considered as synchronization between the pixel voltage and the second common voltage.

Referring to FIG. 7 again, in an embodiment of the present disclosure, the second TFT TR2 using the first common voltage as a source is further provided and the parasitic capacitor Cgs is designed to be the same as Cgc' to synchronize a kickback voltage.

Thus, the internal common line CL having the second common voltage is formed to further form the second storage capacitor Ccc' between the common line and the internal common line CL.

As described above, the second storage capacitor Ccc' has a capacitance between the first common voltage and the second common voltage and may have a capacitance relating to charging and holding of the first common voltage.

The first storage capacitor Cst between the first common line and the pixel electrode has a capacitance between the first common voltage and the pixel voltage and may have a capacitance relating to charging and holding of the pixel voltage.

The first kickback voltage $\Delta Vp$ is a voltage of a direct current applied to liquid crystal due to the first parasitic capacitor Cgs between the first gate electrode and the first source electrode or the first drain electrode.

Further, the second kickback voltage $\Delta Vp'$ is a voltage of a direct current applied to liquid crystal due to the second parasitic capacitor Cgc' between the second gate electrode and the second source electrode or the second drain electrode.

The kickback voltages of the equivalent circuits can be represented by the following equations.

$$\Delta Vp = Cgs \times \Delta Vg/(Cgs + Clc + Cst)$$

$$\Delta Vp' = Cgc' \times \Delta Vg/(Cgc' + Clc + Ccc')$$

Herein, $\Delta Vg$ denotes a difference value between a high value Vgh and a low value Vgl of a gate voltage, Clc denotes a value of the liquid crystal capacitor, and Cst denotes a value of the first storage capacitor. Further, Cgs denotes a parasitic capacitance value generated by the first parasitic capacitor between the first gate electrode and the first source electrode or the first drain electrode.

Furthermore, Ccc' denotes a value of the second storage capacitor, Cgc' denotes a parasitic capacitance value generated by the second parasitic capacitor between the second gate electrode and the second source electrode or the second drain electrode.

According to the synchronization condition as $\Delta Vp = \Delta Vp'$, $Cgs \times \Delta Vg/(Cgs + Clc + Cst)$ is equal to $Cgc' \times \Delta Vg/(Cgc' + Clc + Ccc')$.

If the first and second TFTs TR1 and TR2 are designed identically, Cgs is equal to Cgc', and, thus, $Cgs \times \Delta Vg/(Cgs + Clc + Cst)$ is equal to $Cgs \times \Delta Vg/(Cgs + Clc + Ccc')$.

Therefore, to satisfy $\Delta Vp = \Delta Vp'$, the condition of Cst=Ccc' needs to be satisfied.

Therefore, Cst and Ccc', i.e., the first storage capacitor and the second storage capacitor need to be designed in the same proportion to minimize a difference between $\Delta Vp$ and $\Delta Vp'$.

Figure 10A:
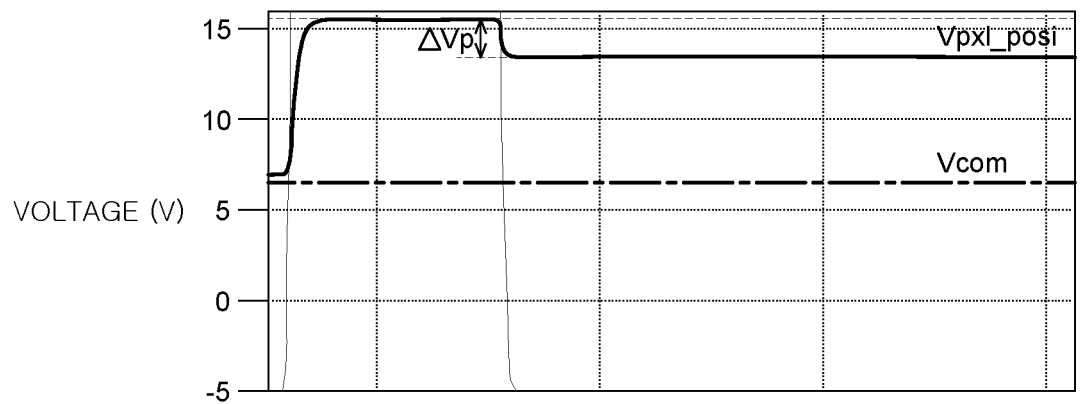
FIGS. 10A, 10B, and 10C are views comparing a pixel voltage for a positive frame between a comparative example and an embodiment of the present disclosure.
Figure 10B:
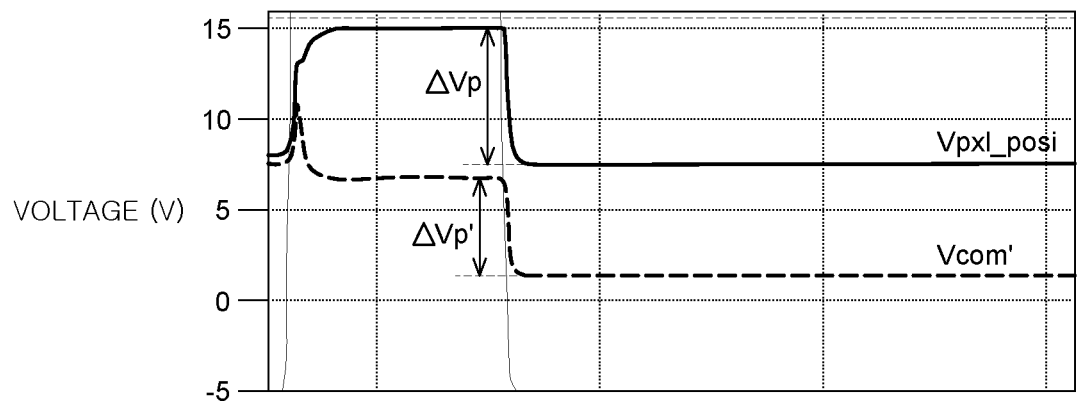
Figure 10C:
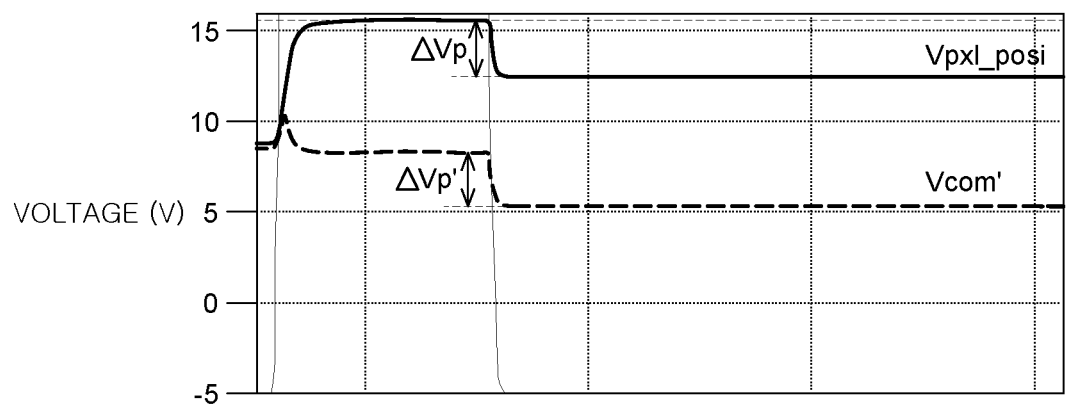

FIG. 10A through FIG. 10C are views comparing a pixel voltage for a positive frame between a comparative example and an embodiment of the present disclosure.

Herein, FIG. 10A illustrates a pixel voltage for a positive frame in a liquid crystal display device according to a comparative example. FIG. 10B illustrates a pixel voltage for a positive frame in the liquid crystal display device according to an embodiment of the present disclosure. FIG. 10C illustrates a pixel voltage for a positive frame in the liquid crystal display device according to an embodiment of the present disclosure.

Figure 11A:
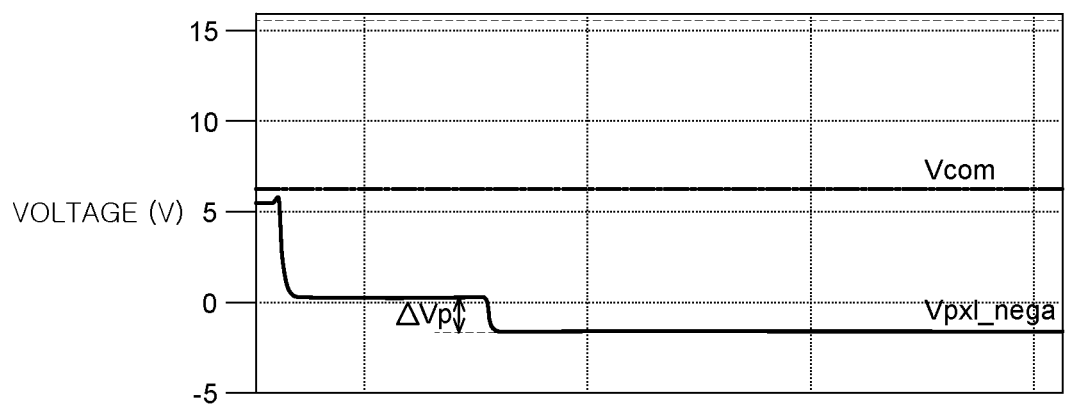
FIGS. 11A, 11B, and 11C are views comparing a pixel voltage for a negative frame between a comparative example and an embodiment of the present disclosure.
Figure 11B:
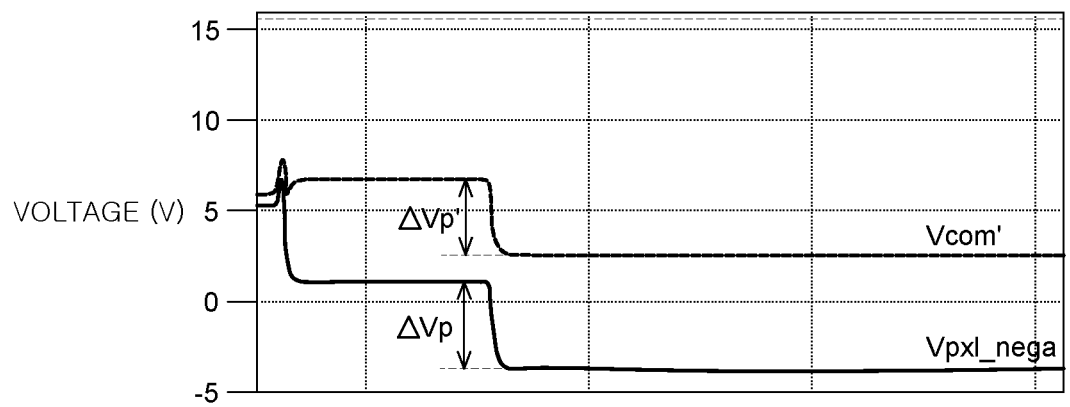
Figure 11C:
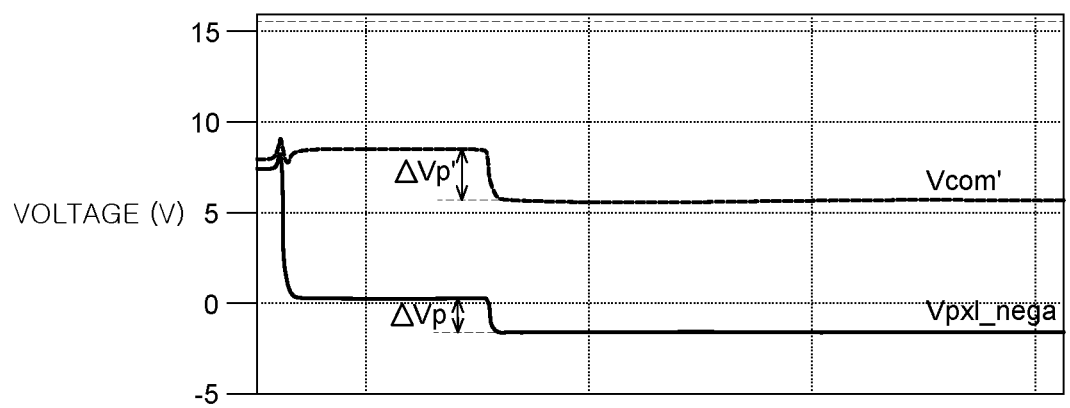

FIG. 11A through FIG. 11C are views comparing a pixel voltage for a negative frame between a comparative example and the present disclosure.

Herein, FIG. 11A illustrates a pixel voltage for a negative frame in the liquid crystal display device according to a comparative example. FIG. 11B illustrates a pixel voltage for a negative frame in the liquid crystal display device according to an embodiment of the present disclosure. FIG. 11C illustrates a pixel voltage for a negative frame in the liquid crystal display device according to an embodiment of the present disclosure.

Referring to FIG. 10A through FIG. 11C, pixel voltages Vpxl_posi and Vpxl_nega applied to liquid crystal decrease by a kickback voltage $\Delta Vp$ over time.

First, referring to FIG. 10A and FIG. 11A, it can be seen that in the liquid crystal display device according to a comparative example, a common voltage Vcom is not changed and the kickback voltage $\Delta Vp$ is 2.05 V. Thus, it can be seen that the pixel voltages Vpxl_posi and Vpxl_nega are greatly changed.

In this regard, referring to FIG. 10B and FIG. 11B, it can be seen that in the liquid crystal display device according to an embodiment of the present disclosure, a second common voltage Vcom' is changed as synchronized with the pixel voltages Vpxl_posi and Vpxl_nega. Further, it can be seen that the second common voltage Vcom' decreases by a kickback voltage $\Delta Vp'$ similar to the pixel voltages Vpxl_posi and Vpxl_nega.

In this case, a difference between the kickback voltages, i.e., $\Delta Vp-\Delta Vp'$, is recovered to 0.96 V, which means an improvement, compared to a comparative example. However, even in this case, it can be seen that the absolute value of $\Delta Vp$ caused by gate coupling is high and variations of the pixel voltages Vpxl_posi and Vpxl_nega in a frame are somewhat high.

Referring to FIG. 10C and FIG. 11C, it can be seen that in the liquid crystal display device according to an embodiment of the present disclosure, the second common voltage Vcom' is changed as synchronized with the pixel voltages Vpxl_posi and Vpxl_nega. Further, it can be seen that the second common voltage Vcom' decreases by the kickback voltage $\Delta Vp'$ similar to the pixel voltages Vpxl_posi and Vpxl_nega.

In this case, a difference in kickback voltage, i.e., $\Delta Vp-\Delta Vp'$, is recovered to 0.12 V close to 0, which means a great improvement, compared to a comparative example and an embodiment. Therefore, it can be seen that the absolute value of $\Delta Vp$ caused by gate coupling is low and variations of the pixel voltages Vpxl_posi and Vpxl_nega in a frame are relatively decreased.

Accordingly, it can be seen that an embodiment of the present disclosure has a greater effect in terms of the absolute value of $\Delta Vp$ and synchronization.

Figure 12:
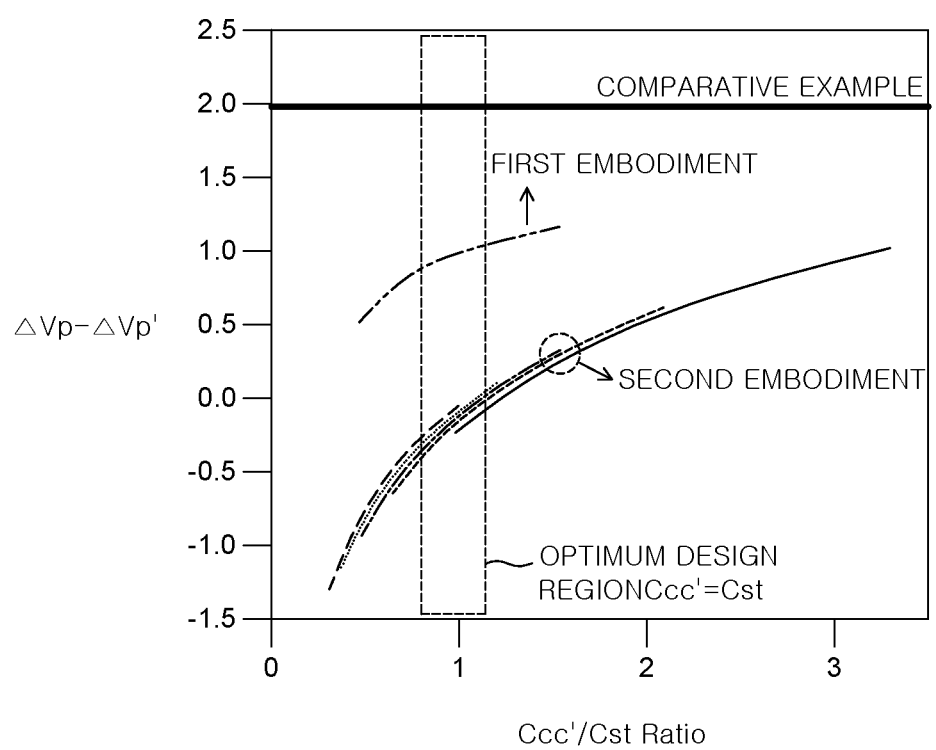
FIG. 12 is a graph comparing a kickback voltage depending on the capacitance ratio between a comparative example and an embodiment of the present disclosure.

FIG. 12 is a graph comparing a kickback voltage depending on the capacitance ratio between a comparative example and the present disclosure.

That is, FIG. 12 illustrates a kickback voltage caused by a capacitance ratio Ccc'/Cst and a difference in kickback voltage in a comparative example and an embodiment of the present disclosure.

In an embodiment of the present disclosure, the liquid crystal capacitor Clc was fixed to 112 fF and a value of the first storage capacitor Cst was variously set to 70, 110, 150, 190, and 230 fF.

Further, in an embodiment of the present disclosure, the liquid crystal capacitor Clc was set to 112 fF and a value of the first storage capacitor Cst was set to 150 fF.

Referring to FIG. 12, it can be seen that the liquid crystal display device of a comparative example does not include the second storage capacitor and has a constant kickback voltage $\Delta Vp$ of 2.05 V regardless of the capacitance ratio Ccc'/Cst.

In contrast, it can be seen that in the liquid crystal display devices of an embodiment, the difference in kickback voltage, i.e., $\Delta Vp-\Delta Vp'$, has a very small value, compared to the kickback voltage $\Delta Vp$ of a comparative example. Further, it can be seen that the difference in kickback voltage increases as the capacitance ratio Ccc'/Cst increases. Furthermore, it can be seen that in an embodiment of the present disclosure, when the capacitance ratio Ccc'/Cst has a value smaller than 1, the absolute value of $\Delta Vp-\Delta Vp'$ increases.

It can be seen that under a condition of Ccc'=Cst for an optimum design region, the difference in kickback voltage, i.e., $\Delta Vp-\Delta Vp'$, is recovered to 0.96 V in an embodiment of the present disclosure and to 0.12 V close to 0 in an embodiment of the present disclosure.

Therefore, it can be seen that if the second storage capacitor Ccc' and the first storage capacitor Cst are designed in the same proportion to synchronize the kickback voltage $\Delta Vp$, the effect can be maximized Thus, it is possible to effectively solve degradation of image quality caused by the kickback voltage $\Delta Vp$.

In an embodiment of the present disclosure, the second storage capacitor Ccc' and the first storage capacitor Cst are designed in the same proportion. Thus, an embodiment of the present disclosure is more effective than a comparative example and an embodiment of the present disclosure and useful in removing flickers and image sticking.

Figure 13:
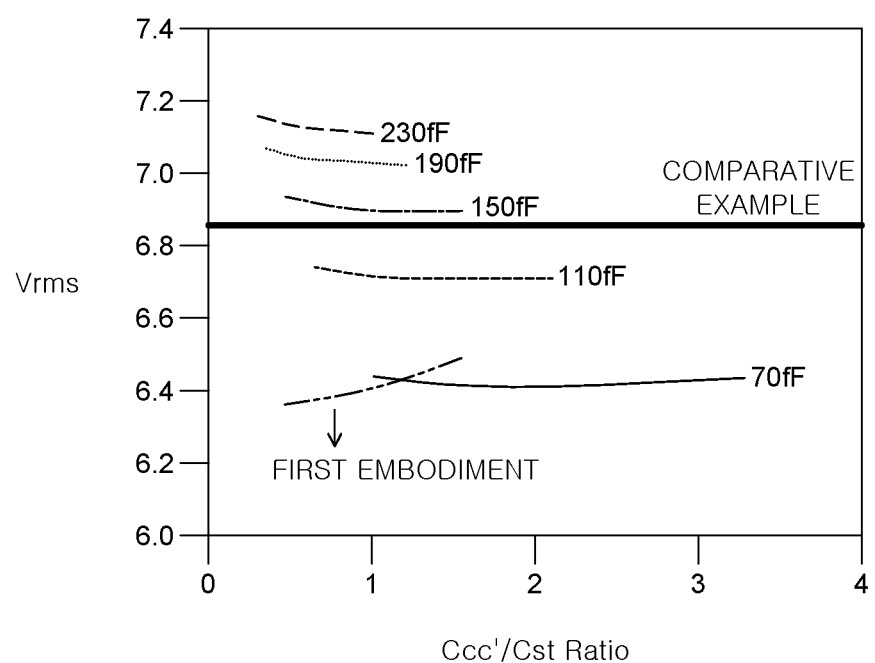
FIG. 13 is a graph comparing an effective voltage depending on the capacitance ratio between a comparative example and an embodiment of the present disclosure.

FIG. 13 is a graph comparing an effective voltage depending on the capacitance ratio between a comparative example and the present disclosure.

FIG. 13 illustrates that in the liquid crystal display device of a comparative example, the liquid crystal capacitor Clc was set to 139 fF and a value of the first storage capacitor Cst was set to 91 fF.

As described above, in an embodiment of the present disclosure, the liquid crystal capacitor Clc was fixed to 112 fF and the value of the first storage capacitor Cst was variously set to 70, 110, 150, 190, and 230 fF.

Further, in an embodiment of the present disclosure, the liquid crystal capacitor Clc was set to 112 fF and the value of the first storage capacitor Cst was set to 150 fF.

Referring to FIG. 13, it can be seen that the liquid crystal display device of a comparative example does not include the second storage capacitor and has a constant effective voltage Vrms of about 6.86 V regardless of the capacitance ratio Ccc'/Cst.

It can be seen that the liquid crystal display device of an embodiment of the present disclosure has a lower effective voltage Vrms than a comparative example and the effective voltage Vrms slightly increases as the capacitance ratio Ccc'/Cst increases.

However, it can be seen that the liquid crystal display device of an embodiment of the present disclosure has a higher effective voltage Vrms than a comparative example when the value of the first storage capacitor Cst is 150 fF or more.

Therefore, since the liquid crystal display device of an embodiment of the present disclosure secures a higher effective voltage Vrms than a comparative example, a driving voltage can be decreased and power consumption can be improved.

Figure 14A:
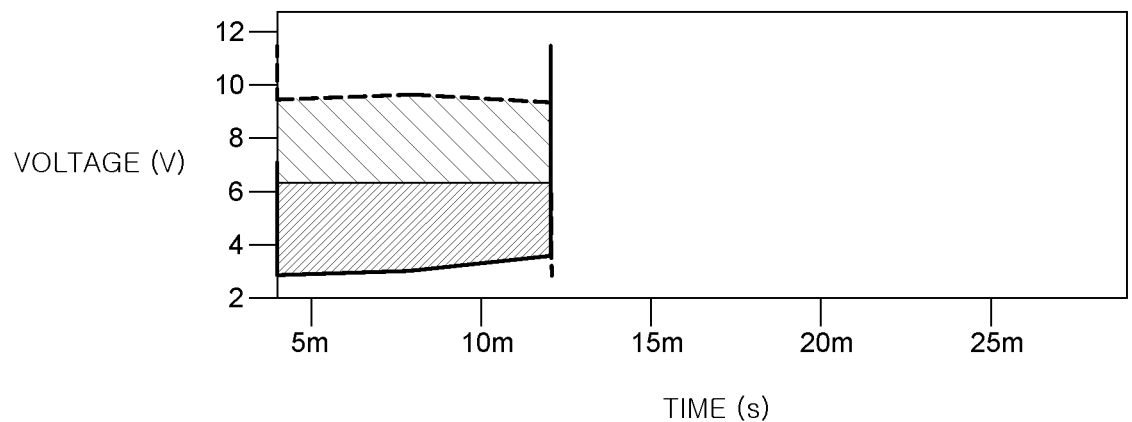
FIG. 14A and FIG. 14B are graphs illustrating examples of voltage changes over time according to a comparative example.
Figure 14B:
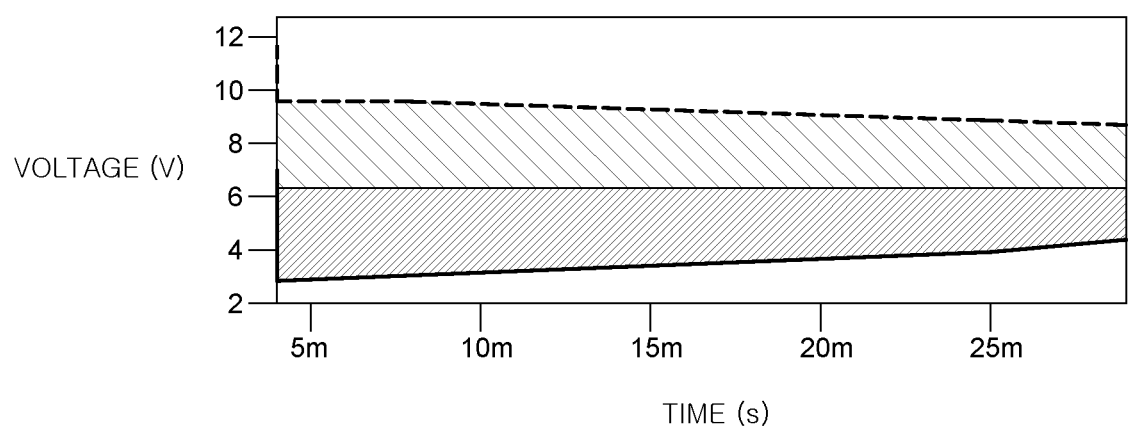

FIG. 14A and FIG. 14B are graphs illustrating examples of voltage changes over time according to a comparative example. For example, FIG. 14A illustrates voltage changes over time in driving at a normal frequency of 120 Hz, and FIG. 14B illustrates voltage changes over time in driving at a low frequency of 40 Hz.

Figure 15A:
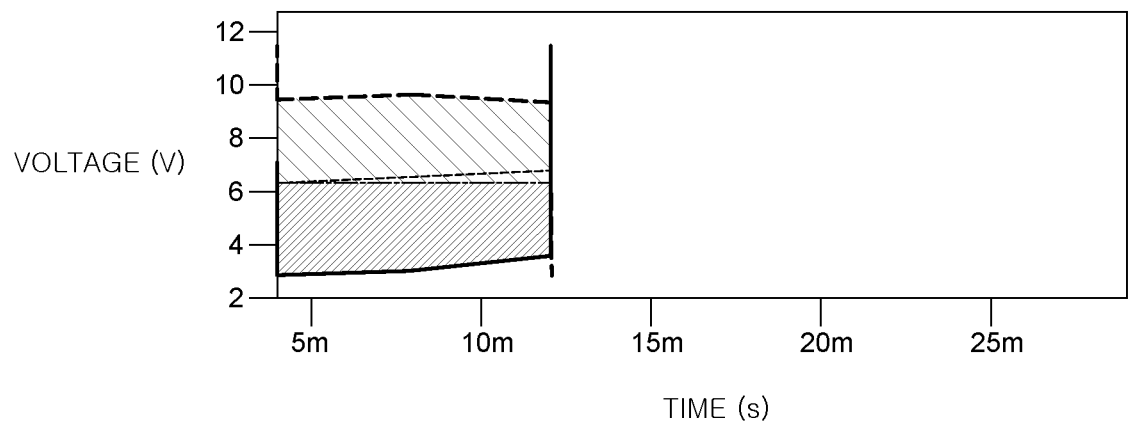
FIG. 15A and FIG. 15B are graphs illustrating examples of voltage changes over time according to an embodiment of the present disclosure.
Figure 15B:
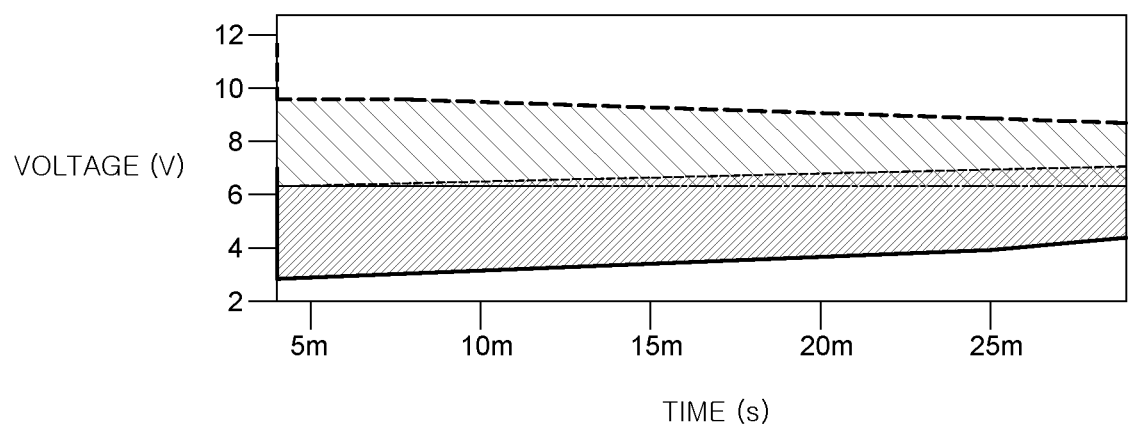

FIG. 15A and FIG. 15B are graphs illustrating examples of voltage changes over time according to an embodiment of the present disclosure. For example, FIG. 15A illustrates voltage changes over time in driving at a normal frequency of 120 Hz, and FIG. 15B illustrates voltage changes over time in driving at a low frequency of 40 Hz.

In FIG. 14A through FIG. 15B, the dotted line graphs represent a positive frame and the solid line graphs represent a negative frame.

Referring to FIG. 14A and FIG. 14B, it can be seen that in the liquid crystal display device of a comparative example, the effective voltage Vrms in driving at a normal frequency of 120 Hz is 3.26 V. In contrast, it can be seen that the effective voltage Vrms in driving at a low frequency of 40 Hz decreases to 2.92 V by about 10.4%, which results in luminance degradation by about 10%.

Referring to FIG. 15A and FIG. 15B, it can be seen that in the liquid crystal display device of an embodiment of the present disclosure, the effective voltage Vrms in driving at a normal frequency of 120 Hz is 3.26 V. Further, it can be seen that the effective voltage Vrms in driving at a low frequency of 40 Hz decreases to 3.02 V by about 7.3%, which results in luminance degradation by about 7%. Therefore, it can be seen that a drop of the effective voltage Vrms is improved by 30% in an embodiment, compared to a comparative example.

As described above, in an embodiment of the present disclosure, the pixel voltage is synchronized with the second common voltage, which has the same effect as an improvement of off-current. Further, according to an embodiment of the present disclosure, it can be seen that the effective voltage Vrms is improved by about 30% and the luminance degradation caused by low-frequency driving is improved.

Figure 16A:
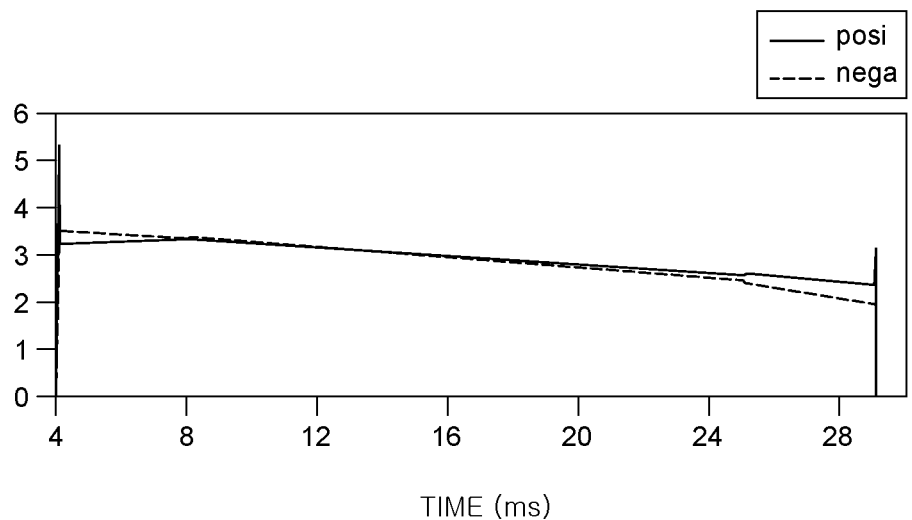
FIG. 16A and FIG. 16B are views comparing a change in effective voltage over time between a comparative example and an embodiment of the present disclosure.
Figure 16B:
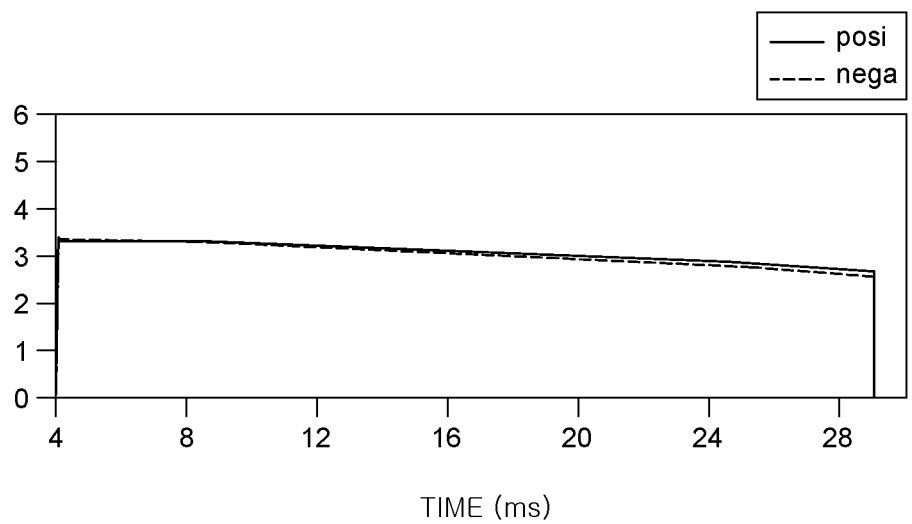

FIG. 16A and FIG. 16B are views comparing a change in effective voltage over time between a comparative example and an embodiment of the present disclosure.

FIG. 16A illustrates a change in effective voltage over time in the liquid crystal display device according to a comparative example. FIG. 16B illustrates a change in effective voltage over time in the liquid crystal display device according to an embodiment of the present disclosure.

In FIG. 16A and FIG. 16B, the solid line graphs and the dotted line graphs represent a positive frame and a negative frame, respectively.

Referring to FIG. 16A and FIG. 16B, it can be seen that in the liquid crystal display device of a comparative example, the effective voltage Vrms is asymmetric for each frame, i.e., a positive frame and a negative frame, and, thus, flickers occur. However, it can be seen that in an embodiment of the present disclosure, the effective voltage Vrms is almost symmetric for each frame, i.e., a positive frame and a negative frame, and, thus, flickers are improved.

The exemplary embodiments of the present disclosure can also be described as follows:

According to an aspect of the present disclosure, there is provided a liquid crystal display device. The liquid crystal display device includes a plurality of gate lines and a plurality of data lines that intersect each other on a substrate and define a plurality of sub-pixels; a plurality of common electrodes and a plurality of pixel electrodes that are alternately disposed within the sub-pixels; a first thin film transistor comprising a first gate electrode connected to the gate line, a first source electrode connected to the data line, and a first drain electrode connected to the pixel electrode; a first common line applied with a first common voltage; and a second thin film transistor comprising a second gate electrode connected to the gate line, a second source electrode connected to the first common line, and a second drain electrode connected to the common electrode.

The first gate electrode and the second gate electrode may be connected to a same gate line to receive a same gate voltage.

The first common line may be disposed at a boundary between vertically adjacent sub-pixels and disposed in parallel to the gate line.

The first gate electrode, the second gate electrode, and the first common line may be disposed on the same layer on the substrate.

The liquid crystal display device may further include a first insulating layer disposed on the first gate electrode, the second gate electrode, and the first common line.

The first source electrode, the first drain electrode, the second source electrode, and the second drain electrode may be disposed on the first insulating layer.

The liquid crystal display device may further include a second insulating layer disposed on the first source electrode, the first drain electrode, the second source electrode, and the second drain electrode, the common electrode and the pixel electrode may be disposed on the second insulating layer.

The liquid crystal display device may further include a shield line connected to the first common line, and disposed in parallel to the data line and disposed on at least one side of the data line along the data line.

The liquid crystal display device may further include a connection line connected to one end of the shield line and disposed in parallel to the gate line.

The liquid crystal display device may further include a first contact hole that exposes a part of the first drain electrode by removing a part of the second insulating layer, wherein the pixel electrode line may be electrically connected to the first drain electrode through the first contact hole.

A part of the first drain electrode may be disposed on the first common line and may form a first storage capacitor together with the first common line.

The liquid crystal display device may further include a second contact hole that exposes a part of the first common line by removing a part of the first insulating layer, wherein the second source electrode may be electrically connected to the first common line through the second contact hole.

The liquid crystal display device may further include a third contact hole that exposes a part of the second drain electrode by removing a part of the second insulating layer, wherein the common electrode may be electrically connected to the second drain electrode through the third contact hole.

The pixel electrode may be applied with a pixel voltage through the first drain electrode, the second source electrode may be applied with the first common voltage through the first common line, and the common electrode may be applied with a second common voltage different from the first common voltage through the second drain electrode.

The liquid crystal display device may further include a second common line disposed on a same layer as the common electrode and applied with the first common voltage.

The second common line may be disposed at the boundary between vertically adjacent sub-pixels.

The second common line may be extended above the data line.

The second common line may constitute a second storage capacitor together with the common electrode.

The first storage capacitor may have a capacitance between the first common voltage and the pixel voltage.

The second storage capacitor may have a capacitance between the first common voltage and the second common voltage.

The second common voltage may be synchronized with the pixel voltage.

The first storage capacitor and the second storage capacitor may have the same capacitance.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A liquid crystal display device, comprising:
   a plurality of gate lines and a plurality of data lines that intersect each other on a substrate and define a plurality of sub-pixels;
   a plurality of common electrodes and a plurality of pixel electrodes that are alternately disposed within the plurality of sub-pixels;
   a first thin film transistor comprising a first gate electrode connected to a gate line of the plurality of gate lines, a first source electrode connected to a data line of the plurality of data lines, and a first drain electrode connected to a pixel electrode of the plurality of pixel electrodes;
   a first common line applied with a first common voltage; and
   a second thin film transistor comprising a second gate electrode connected to the gate line, a second source electrode connected to the first common line, and a second drain electrode connected to a common electrode of the plurality of common electrodes,
   wherein a part of the first drain electrode is disposed on the first common line and forms a first storage capacitor together with the first common line.

2. The liquid crystal display device according to claim 1, wherein the first gate electrode and the second gate electrode are connected to a same gate line to receive a same gate voltage.

3. The liquid crystal display device according to claim 1, wherein the first common line is disposed at a boundary between vertically adjacent sub-pixels and disposed in parallel to the gate line.

4. The liquid crystal display device according to claim 1, wherein the first gate electrode, the second gate electrode, and the first common line are disposed on a same layer on the substrate.

5. The liquid crystal display device according to claim 1, further comprising a first insulating layer disposed on the first gate electrode, the second gate electrode, and the first common line.

6. The liquid crystal display device according to claim 5, wherein the first source electrode, the first drain electrode, the second source electrode, and the second drain electrode are disposed on the first insulating layer.

7. The liquid crystal display device according to claim 6, further comprising:
   a second contact hole that exposes a part of the first common line by removing a part of the first insulating layer,
   wherein the second source electrode is electrically connected to the first common line through the second contact hole.

8. The liquid crystal display device according to claim 1, further comprising a second insulating layer disposed on the first source electrode, the first drain electrode, the second source electrode, and the second drain electrode,
   wherein the common electrode and the pixel electrode are disposed on the second insulating layer.

9. The liquid crystal display device of claim 8, further comprising:
   a first contact hole that exposes a part of the first drain electrode by removing a part of the second insulating layer,
   wherein a pixel electrode line is electrically connected to the first drain electrode through the first contact hole.

10. The liquid crystal display device according to claim 1, further comprising:
    a shield line connected to the first common line, and disposed in parallel to the data line and on at least one side of the data line along the data line.

11. The liquid crystal display device according to claim 10, further comprising:
    a connection line connected to one end of the shield line and disposed in parallel to the gate line.

12. The liquid crystal display device according to claim 11, further comprising:
    a third contact hole that exposes a part of the second drain electrode by removing a part of a second insulating layer,
    wherein the common electrode is electrically connected to the second drain electrode through the third contact hole.

13. The liquid crystal display device according to claim 1, wherein the pixel electrode is applied with a pixel voltage through the first drain electrode, the second source electrode is applied with the first common voltage through the first common line, and the common electrode is applied with a second common voltage different from the first common voltage through the second drain electrode.

14. The liquid crystal display device according to claim 13, wherein the first storage capacitor has a capacitance between the first common voltage and the pixel voltage.

15. The liquid crystal display device according to claim 13, wherein an amplitude of the second common voltage is synchronized with an amplitude of the pixel voltage.

16. The liquid crystal display device according to claim 13, further comprising:
- a second common line disposed on a same layer as the common electrode and applied with the first common voltage.

17. The liquid crystal display device according to claim 16, wherein the second common line is disposed at a boundary between vertically adjacent sub-pixels.

18. The liquid crystal display device according to claim 16, wherein the second common line is extended above the data line.

19. The liquid crystal display device according to claim 16, wherein the second common line constitutes a second storage capacitor together with the common electrode.

20. The liquid crystal display device according to claim 19, wherein the second storage capacitor has a capacitance between the first common voltage and the second common voltage.

21. The liquid crystal display device according to claim 19, wherein the first storage capacitor and the second storage capacitor have a same capacitance.

* * * * *